United States Patent
Ohashi et al.

(10) Patent No.: US 11,489,046 B2
(45) Date of Patent: Nov. 1, 2022

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Teruyuki Ohashi, Kawasaki Kanagawa (JP); Hiroshi Kono, Himeji Hyogo (JP); Masaru Furukawa, Himeji Hyogo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/273,414

(22) Filed: Feb. 12, 2019

(65) Prior Publication Data

US 2020/0091295 A1 Mar. 19, 2020

(30) Foreign Application Priority Data

Sep. 15, 2018 (JP) .............................. JP2018-173141

(51) Int. Cl.
*H01L 29/16* (2006.01)
*H01L 29/10* (2006.01)
(Continued)

(52) U.S. Cl.
CPC ........ *H01L 29/1608* (2013.01); *H01L 29/086* (2013.01); *H01L 29/0878* (2013.01);
(Continued)

(58) Field of Classification Search
CPC ............... H01L 29/1608; H01L 29/086; H01L 29/7806; H01L 29/0878; H01L 29/1095
See application file for complete search history.

(56) References Cited

U.S. PATENT DOCUMENTS 5,688,725 A * 11/1997 Darwish ............. H01L 29/1095
257/E29.066
9,786,778 B1 * 10/2017 Morizuka ........... H01L 29/1608
(Continued)

FOREIGN PATENT DOCUMENTS

JP 2009-277809 A 11/2009
JP 2016-162897 A 9/2016
(Continued)

OTHER PUBLICATIONS

S. Hino et al., "Demonstration of SiC-MOSFET Embedding Schottky Barier Diode for Inactivation of Parasitic Body Diode," Materials Science Forum, vol. 897, Silicon Carbide and Related Materials, 2016, pp. 477-482.
(Continued)

*Primary Examiner* — Aaron J Gray
(74) *Attorney, Agent, or Firm* — Allen & Overy LLP

(57) ABSTRACT

A semiconductor device according to an embodiment includes, a silicon carbide layer having first and second planes; a first electrode on the first plane; a second electrode on the second plane; a first conductivity type first silicon carbide region; second and third silicon carbide regions of a second conductivity type between the first silicon carbide region and the first plane; a first conductivity type fifth silicon carbide region between the first and the second silicon carbide region with higher impurity concentration than the first silicon carbide region; a first conductivity type sixth silicon carbide region between the first and the third silicon carbide region with higher impurity concentration than the first silicon carbide region; a first conductivity type seventh silicon carbide region between the fifth and the sixth silicon carbide region with lower impurity concentration than the fifth and the sixth silicon carbide region; and a gate electrode.

11 Claims, 15 Drawing Sheets

(51) Int. Cl.
*H01L 29/08* (2006.01)
*H01L 29/78* (2006.01)
*H01L 29/36* (2006.01)

(52) U.S. Cl.
CPC .......... *H01L 29/1095* (2013.01); *H01L 29/36* (2013.01); *H01L 29/7806* (2013.01)

(56) References Cited

U.S. PATENT DOCUMENTS

| | | | |
|---|---|---|---|
| 9,799,734 B2 | 10/2017 | Ishigaki et al. | |
| 9,887,285 B1 | 2/2018 | Oota et al. | |
| 2003/0080355 A1* | 5/2003 | Shirai | H01L 29/7802 257/E29.066 |
| 2004/0119076 A1* | 6/2004 | Ryu | H01L 29/66068 257/77 |
| 2016/0133706 A1 | 5/2016 | Ishigaki et al. | |
| 2019/0371935 A1 | 12/2019 | Hatta et al. | |
| 2020/0312995 A1* | 10/2020 | Nagahisa | H01L 29/66068 |

FOREIGN PATENT DOCUMENTS

| | | | |
|---|---|---|---|
| JP | 2016162897 A * | 9/2016 | |
| JP | 2017-168561 A | 9/2017 | |
| JP | 2018-049951 A | 3/2018 | |
| WO | 2014-203317 A1 | 12/2014 | |
| WO | 2017-010164 A1 | 1/2017 | |
| WO | 2018/155553 A1 | 8/2018 | |

OTHER PUBLICATIONS

Fu-Jen Hsu et al., "High Efficiency High Reliability SiC MOSFET with Monolithically Integrated Schottky Rectifier," Proceedings of the 29th International Symposium on Power Semiconductor Devices & ICs, Sapporo, 2017, pp. 45-48.

* cited by examiner

SEMICONDUCTOR DEVICE

CROSS-REFERENCE TO RELATED APPLICATION

This application is based upon and claims the benefit of priority from Japanese Patent Application No. 2018-173141, filed on Sep. 15, 2018, the entire contents of which are incorporated herein by reference.

FIELD

Embodiments described herein relate generally to a semiconductor device.

BACKGROUND

A silicon carbide is expected as a material for next generation semiconductor devices. In comparison with silicon, the silicon carbide has superior physical properties such as a band gap of about 3 times, a breakdown field strength of about 10 times, and a thermal conductivity of about 3 times. By utilizing these characteristics, for example, it is possible to realize a metal oxide semiconductor field effect transistor (MOSFET) with a high breakdown voltage and a low loss, and can be operate at a high temperature.

A vertical type MOSFET using silicon carbide includes a pn junction diode as a body diode. For example, the MOSFET is used as a switching element connected to an inductive load. In this case, even when the MOSFET is turned off, by using the body diode, it becomes possible to allow the reflux current to flow.

However, when a reflux current is allowed to flow by using a body diode, stacking faults grow in the silicon carbide layer due to the recombination energy of carriers, and thus, there is a concern that the on-resistance of the MOSFET may increase. An increase in the on-resistance of the MOSFET causes degradation in the reliability of the MOSFET.

DETAILED DESCRIPTION

Figure 1:
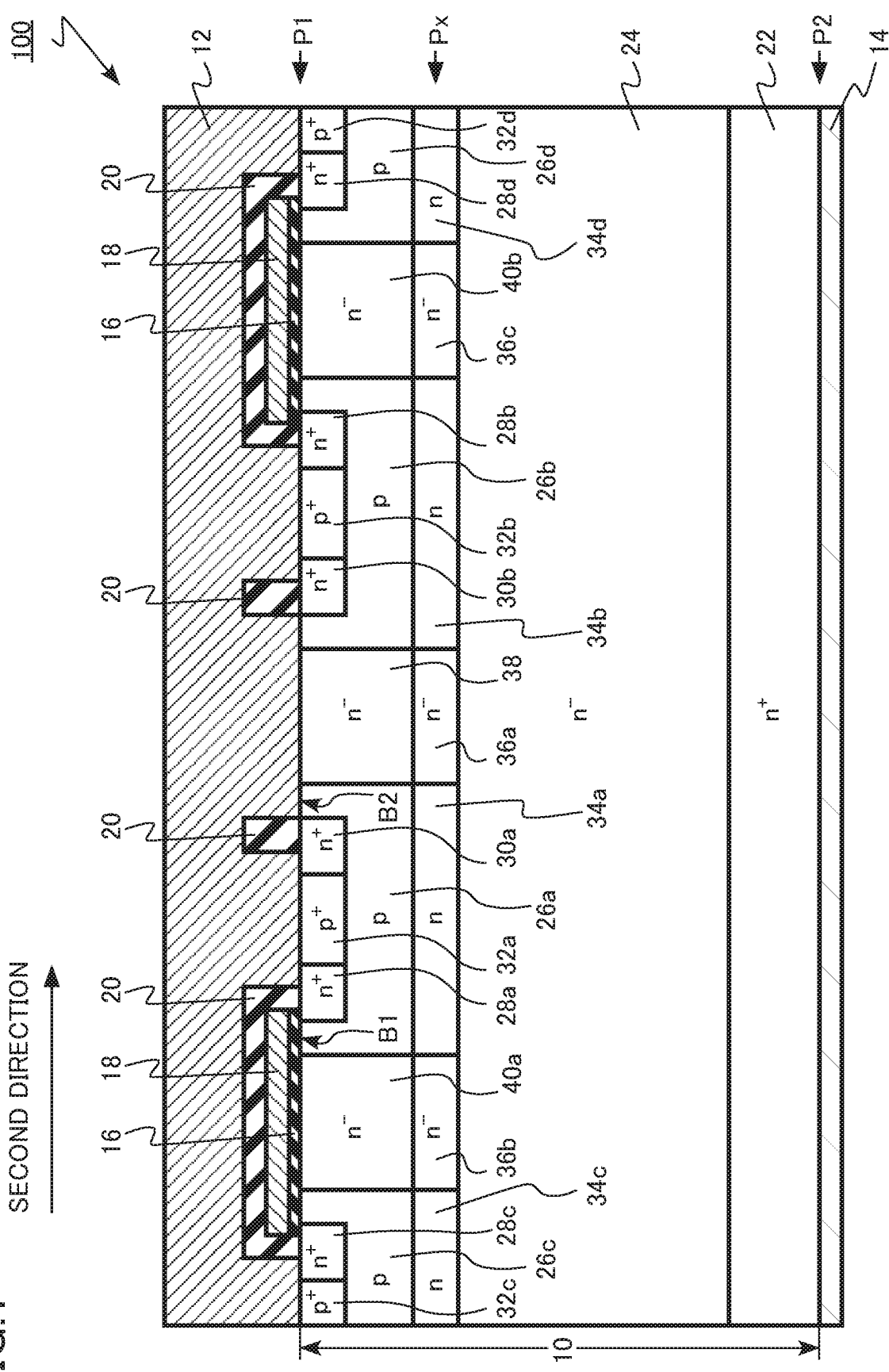
FIG. 1 is a schematic cross-sectional view of a semiconductor device according to a first embodiment.

Hereinafter, embodiments of the invention will be described with reference to the drawings. In addition, the following description, the same or similar members or the like are denoted by the same reference numerals, and the description of the members or the like once described may be omitted as appropriate.

In addition, in the following description, the notations $n^+$, n, $n^-$, $p^+$, p, and $p^-$ indicate relative magnitude of impurity concentration in respective conductivity types. That is, $n^+$ indicates that the n-type impurity concentration is relatively higher than that of n, and $n^-$ indicates that the n-type impurity concentration is relatively lower than that of n. In addition, $p^+$ indicates that the p-type impurity concentration is relatively higher than that of p, and $p^-$ indicates that the p-type impurity concentration is relatively lower than that of p. In addition, sometimes, the $n^+$-type and the $n^-$-type may be simply described as n-type, and the $p^+$-type and the $p^-$-type may be simply described as the p-type.

The impurity concentration can be measured by secondary ion mass spectrometry (SIMS), for example. In addition, a relative magnitude of an impurity concentration may also be determined from a magnitude of a carrier concentration obtained by, for example, scanning capacitance microscope (SCM). It is considered that the relative magnitude of an impurity concentration is coincides with determined from a relative magnitude of a carrier concentration obtained by SCM. In addition, a distance such as a depth and a thickness of an impurity region can be obtained by, for example, SIMS. In addition, the distance such as a depth, a thickness, a width, and an interval of an impurity region can be obtained from a combined image of, for example, an SCM image and an atomic force microscope (AFM) image.

First Embodiment

A semiconductor device according to a first embodiment includes: a silicon carbide layer having a first plane and a second plane opposite to the first plane; a first electrode provided on a side of the first plane of the silicon carbide layer; a second electrode provided on a side of the second plane of the silicon carbide layer; a first silicon carbide region of a first conductivity type provided in the silicon carbide layer; a second silicon carbide region of a second conductivity type provided between the first silicon carbide region and the first plane and having a first portion in contact with the first plane; a third silicon carbide region of the second conductivity type provided between the first silicon carbide region and the first plane and separated from the second silicon carbide region; a fourth silicon carbide region of the first conductivity type provided between the second silicon carbide region and the first plane and in contact with the first electrode; a fifth silicon carbide region of the first conductivity type provided between the first silicon carbide region and the second silicon carbide region, a first conductivity type impurity concentration of the fifth silicon carbide region being higher than a first conductivity type impurity concentration of the first silicon carbide region; a sixth silicon carbide region of the first conductivity type provided between the first silicon carbide region and the third silicon carbide region, a first conductivity type impurity concentration of the sixth silicon carbide region being higher than the first conductivity type impurity concentration of the first silicon carbide region; a seventh silicon carbide region of the first conductivity type provided between the fifth silicon carbide region and the sixth silicon carbide region, a first conductivity type impurity concentration of the seventh silicon carbide region being lower than the first conductivity type impurity concentration of the fifth silicon carbide region and the first conductivity type impurity concentration of the sixth silicon carbide region; an eighth silicon carbide region of the first conductivity type provided between the seventh silicon carbide region and the first plane and being in contact with the first electrode; a gate electrode provided on a side of the first plane of the silicon carbide layer and facing the first portion of the second silicon carbide region; and a gate insulating layer provided between the gate electrode and the first portion.

Figure 2:
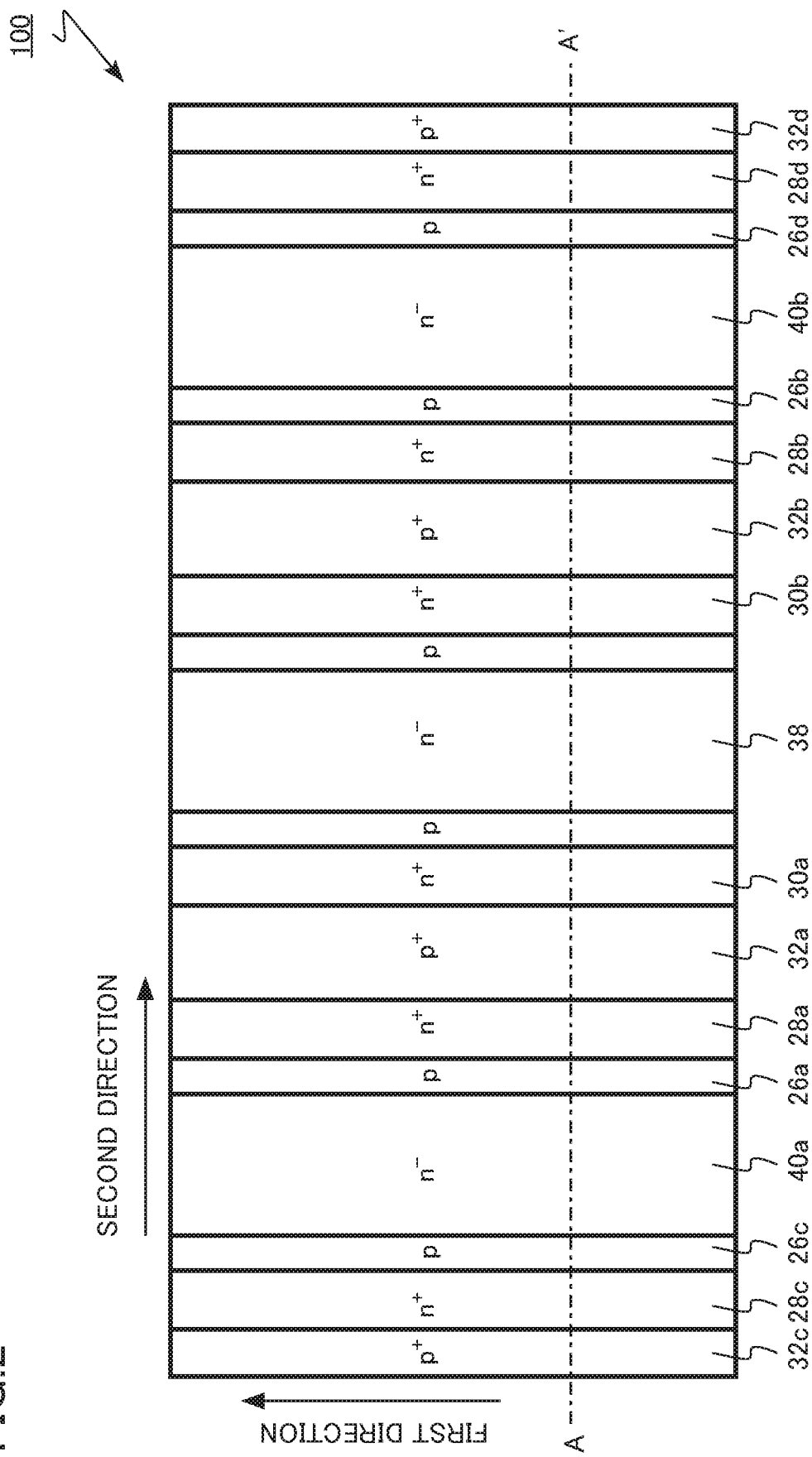
FIG. 2 is a schematic top view of the semiconductor device according to the first embodiment.
Figure 3:
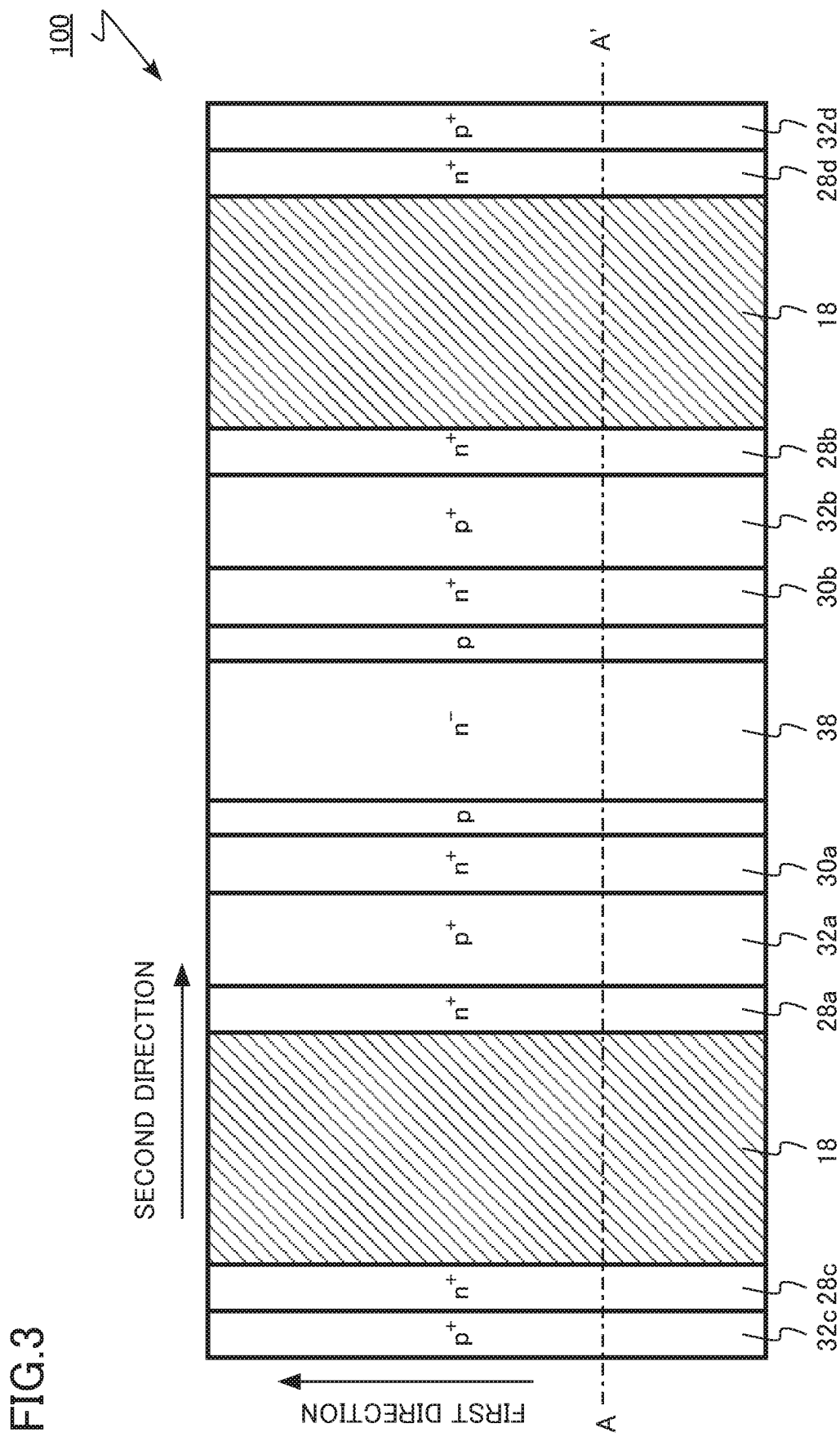
FIG. 3 is a schematic top view of the semiconductor device according to the first embodiment.

FIG. 1 is a schematic cross-sectional view of the semiconductor device according to the first embodiment. FIGS. 2 and 3 are schematic top views of the semiconductor device according to the first embodiment. FIG. 2 is a view illustrating a pattern of the silicon carbide region on the front surface of the silicon carbide layer. FIG. 3 is a view in which a pattern of the gate electrode is superimposed on FIG. 2. FIG. 1 is a cross-sectional view taken along line A-A' of FIGS. 2 and 3.

The semiconductor device according to the first embodiment is a planar gate type vertical MOSFET 100 using silicon carbide. The MOSFET 100 according to the first embodiment is, for example, a double implantation MOSFET (DIMOSFET) in which a body region and a source region are formed by ion implantation. In addition, the semiconductor device according to the first embodiment includes a Schottky barrier diode (SBD) as a built-in diode.

Hereinafter, a case where the first conductivity type is n-type and the second conductivity type is p-type will be described as an example. The MOSFET 100 is a vertical type n-channel MOSFET using electrons as carriers.

The MOSFET 100 includes a silicon carbide layer 10, a source electrode 12 (first electrode), a drain electrode 14 (second electrode), a gate insulating layer 16, a gate electrode 18, and an interlayer insulating layer 20.

In the silicon carbide layer 10, an $n^+$-type drain region 22, an $n^-$-type drift region 24 (first silicon carbide region), a p-type first body region 26a (second silicon carbide region), a p-type second body region 26b (third silicon carbide region), a p-type third body region 26c (tenth silicon carbide region), a p-type fourth body region 26d, an $n^+$-type first source region 28a (fourth silicon carbide region), an $n^+$-type second source region 28b, an $n^+$-type third source region 28c, an $n^+$-type fourth source region 28d, an $n^+$-type first n-type region 30a, an $n^+$-type second n-type region 30b, a $p^+$-type first body contact region 32a, a $p^+$-type second body contact region 32b, a $p^+$-type third body contact region 32c, a $p^+$-type fourth body contact region 32d, an n-type first high concentration region 34a (fifth silicon carbide region), an n-type second high concentration region 34b (sixth silicon carbide region), an n-type third high concentration region 34c, an n-type fourth high concentration region 34d, an $n^-$-type first low concentration region 36a (seventh silicon carbide region), an $n^-$-type second low concentration region 36b (ninth silicon carbide region), an $n^-$-type third low concentration region 36c, an $n^-$-type SBD cathode region 38 (eighth silicon carbide region), an $n^-$-type first JFET region 40a, and an $n^-$-type second JFET region 40b (eleventh silicon carbide region) are provided.

The silicon carbide layer 10 is provided between the source electrode 12 and the drain electrode 14. The silicon carbide layer 10 is provided between the gate electrode 18 and the drain electrode 14. The silicon carbide layer 10 is single crystal SiC. The silicon carbide layer 10 is, for example, 4H—SiC.

The silicon carbide layer 10 has a first plane ("P1" in FIG. 1) and a second plane ("P2" in FIG. 1). Hereinafter, the first plane may be referred to as a front surface, and the second plane may be referred to as a back surface. In addition, hereinafter, the "depth" denotes the depth based on the first plane.

For example, the first plane P1 is a plane inclined at 0 degrees or more and 8 degrees or less with respect to the (0001) plane. In addition, for example, the second plane P2 is a plane inclined at 0 degrees or more 8 degrees or less with respect to the (000-1) plane. The (0001) plane is called a silicon plane. The (000-1) plane is called a carbon plane.

The $n^+$-type drain region 22 is provided on the back surface side of the silicon carbide layer 10. The drain region 22 contains, for example, nitrogen (N) as n-type impurities. The n-type impurity concentration of the drain region 22 is, for example, $1\times10^{18}$ cm$^{-3}$ or more and $1\times10^{21}$ cm$^{-3}$ or less.

The $n^-$-type drift region 24 is provided between the drain region 22 and the first plane P1. The $n^-$-type drift region 24 is provided between the source electrode 12 and the drain electrode 14. The $n^-$-type drift region 24 is provided between the gate electrode 18 and the drain electrode 14.

The $n^-$-type drift region 24 is provided on the drain region 22. The drift region 24 contains, for example, nitrogen (N) as n-type impurities. The n-type impurity concentration of the drift region 24 is lower than the n-type impurity concentration of the drain region 22. The n-type impurity concentration of the drift region 24 is, for example, $4\times10^{14}$ cm$^{-3}$ or more and $1\times10^{17}$ cm$^{-3}$ or less. The thickness of the drift region 24 is, for example, 5 μm or more and 150 μm or less.

The p-type first body region 26a, the second body region 26b, the third body region 26c, and the fourth body region 26d are provided between the drift region 24 and the first plane P1. The first body region 26a, the second body region 26b, the third body region 26c, and the fourth body region 26d are separated from each other. The first body region 26a, the second body region 26b, the third body region 26c, and the fourth body region 26d function as a channel region of the MOSFET 100.

The first body region 26a, the second body region 26b, the third body region 26c, and the fourth body region 26d contain, for example, aluminum (Al) as p-type impurities. The p-type impurity concentrations of the first body region 26a, the second body region 26b, the third body region 26c, and the fourth body region 26d are, for example, $1\times10^{17}$ cm$^{-3}$ or more and $5\times10^{17}$ cm$^{-3}$ or less.

The depths of the first body region 26a, the second body region 26b, the third body region 26c, and the fourth body region 26d are, for example, 0.3 μm or more and 0.8 nm or less.

The first body region 26a, the second body region 26b, the third body region 26c, and the fourth body region 26d are fixed to the potential of the source electrode 12.

The first body region 26a has a first portion ("B1" in FIG. 1) in contact with the first plane P1 and a second portion ("B2" in FIG. 1) in contact with the first plane P1.

The n+-type first source region 28a is provided between the first body region 26a and the first plane P1. The n+-type second source region 28b is provided between the second body region 26b and the first plane P1. The n+-type third source region 28c is provided between the third body region 26c and the first plane P1. The n+-type fourth source region 28d is provided between the fourth body region 26d and the first plane P1.

The first source region 28a, the second source region 28b, the third source region 28c, and the fourth source region 28d contain, for example, phosphorus (P) as n-type impurities. The n-type impurity concentrations of the first source region 28a, the second source region 28b, the third source region 28c, and the fourth source region 28d are higher than the n-type impurity concentration of the drift region 24.

The n-type impurity concentrations of the first source region 28a, the second source region 28b, the third source region 28c, and the fourth source region 28d are, for example, $1 \times 10^{19}$ cm$^{-3}$ or more and $1 \times 10^{21}$ cm$^{-3}$ or less. The depths of the first source region 28a, the second source region 28b, the third source region 28c, and the fourth source region 28d are smaller than the depths of the first body region 26a, the second body region 26b, the third body region 26c and the fourth body region 26d and are, for example, 0.1 μm or more and 0.3 μm or less.

The first source region 28a, the second source region 28b, the third source region 28c, and the fourth source region 28d are in contact with the source electrode 12. The contact between the first source region 28a, the second source region 28b, the third source region 28c, and the fourth source region 28d and the source electrode 12 is, for example, ohmic contact.

The first source region 28a, the second source region 28b, the third source region 28c, and the fourth source region 28d are fixed to the potential of the source electrode 12.

The n+-type first n-type region 30a is provided between the first body region 26a and the first plane P1. The n+-type second n-type region 30b is provided between the second body region 26b and the first plane P1.

The first n-type region 30a and the second n-type region 30b contain, for example, phosphorus (P) as n-type impurities. The n-type impurity concentrations of the first n-type region 30a and the second n-type region 30b are equal to the n-type impurity concentrations of the first source region 28a, the second source region 28b, the third source region 28c, and the fourth source region 28d.

The p+-type first body contact region 32a is provided between the first body region 26a and the first plane P1. The p+-type second body contact region 32b is provided between the second body region 26b and the first plane P1. The p+-type third body contact region 32c is provided between the third body region 26c and the first plane P1. The p+-type fourth body contact region 32d is provided between the fourth body region 26d and the first plane P1.

The impurity concentrations of p-type impurities in the first body contact region 32a, the second body contact region 32b, the third body contact region 32c, and the fourth body contact region 32d are higher than the impurity concentrations of p-type impurities in the first body region 26a, the second body region 26b, the third body region 26c, and the fourth body region 26d.

The first body contact region 32a, the second body contact region 32b, the third body contact region 32c, and the fourth body contact region 32d contain, for example, aluminum (Al) as p-type impurities. The p-type impurity concentration of the first body contact region 32a, the second body contact region 32b, the third body contact region 32c, and the fourth body contact region 32d is, for example, $1 \times 10^{19}$ cm$^{-3}$ or more and $1 \times 10^{21}$ cm$^{-3}$ or less.

The depths of the first body contact region 32a, the second body contact region 32b, the third body contact region 32c, and the fourth body contact region 32d are, for example, 0.3 μm or more and 0.6 μm or less.

The first body contact region 32a, the second body contact region 32b, the third body contact region 32c, and the fourth body contact region 32d are in contact with the source electrode 12.

The n-type first high concentration region 34a is provided between the drift region 24 and the first body region 26a. The n-type second high concentration region 34b is provided between the drift region 24 and the second body region 26b. The n-type third high concentration region 34c is provided between the drift region 24 and the third body region 26c. The n-type fourth high concentration region 34d is provided between the drift region 24 and the fourth body region 26d.

The first high concentration region 34a is, for example, located between the end portion and the vicinity of the end portion of the first body region 26a facing the second body region 26b and the drift region 24. The second high concentration region 34b is, for example, located between the end portion and the vicinity of the end portion of the second body region 26b facing the first body region 26a and the drift region 24.

The first high concentration region 34a is, for example, located between the second portion B2 where the first body region 26a is in contact with the first electrode 12 and the drift region 24. The second high concentration region 34b is, for example, located between a portion where the second body region 26b is in contact with the first electrode 12 and the drift region 24.

The width of the first high concentration region 34a in the second direction is, for example, substantially equal to the width of the first body region 26a in the second direction. The width of the second high concentration region 34b in the second direction is, for example, substantially equal to the width of the second body region 26b in the second direction.

The first high concentration region 34a, the second high concentration region 34b, the third high concentration region 34c, and the fourth high concentration region 34d contain, for example, nitrogen (N) as n-type impurities.

The n-type impurity concentrations of the first high concentration region 34a, the second high concentration region 34b, the third high concentration region 34c, and the fourth high concentration region 34d are higher than the n-type impurity concentration of the drift region 24.

The n-type impurity concentrations of the first high concentration region 34a, the second high concentration region 34b, the third high concentration region 34c, and the fourth high concentration region 34d are, for example, $5 \times 10^{16}$ cm$^{-3}$ or more and $4 \times 10^{17}$ cm$^{-3}$ or less. The thicknesses of the first high concentration region 34a, the second high concentration region 34b, the third high concentration region 34c, and the fourth high concentration region 34d are, for example, 0.05 μm or more and 0.5 μm or less.

The n⁻-type first low concentration region 36a is provided between the first high concentration region 34a and the second high concentration region 34b. The n⁻-type second low concentration region 36b is provided between the third high concentration region 34c and the first high concentration region 34a. The n⁻-type third low concentration region 36c is provided between the second high concentration region 34b and the fourth high concentration region 34d.

The first low concentration region 36a, the second low concentration region 36b, and the third low concentration region 36c and the first high concentration region 34a, the second high concentration region 34b, the third high concentration region 34c, and the fourth high concentration region 34d are located in the same plane ("Px" in FIG. 1) parallel to the first plane P1. The first low concentration region 36a, the second low concentration region 36b, the third low concentration region 36c, the first high concentration region 34a, the second high concentration region 34b, the third high concentration region 34c, and the fourth high concentration region 34d extend in the first direction.

The first low concentration region 36a, the second low concentration region 36b, and the third low concentration region 36c contain, for example, nitrogen (N) as n-type impurities.

The n-type impurity concentrations of the first low concentration region 36a, the second low concentration region 36b, and the third low concentration region 36c are lower than the n-type impurity concentrations of the first high concentration region 34a, the second high concentration region 34b, the third high concentration region 34c, and the fourth high concentration region 34d. The n-type impurity concentrations of the first low concentration region 36a, the second low concentration region 36b, and the third low concentration region 36c are for example, 5% or more and 80% or less of the n-type impurity concentrations of the first high concentration region 34a, the second high concentration region 34b, the third high concentration region 34c, and the fourth high concentration region 34d.

The n-type impurity concentrations of the first low concentration region 36a, the second low concentration region 36b, and the third low concentration region 36c are, for example, higher than the n-type impurity concentration of the drift region 24.

The n-type impurity concentrations of the first low concentration region 36a, the second low concentration region 36b, and the third low concentration region 36c are, for example, $1\times10^{16}$ cm⁻³ or more and $4\times10^{17}$ cm⁻³ or less.

The n⁻-type SBD cathode region 38 is provided between the first low concentration region 36a and the first plane P1. The SBD cathode region 38 is provided between the first body region 26a and the second body region 26b.

The SBD cathode region 38 is in contact with the source electrode 12. The junction between the SBD cathode region 38 and the source electrode 12 is Schottky junction. The contact between the SBD cathode region 38 and the source electrode 12 is Schottky contact.

The SBD cathode region 38 together with the source electrode 12 forms an SBD. The source electrode 12 functions as an anode of the SBD, and the SBD cathode region 38 functions as a cathode of the SBD.

The SBD cathode region 38 contains, for example, nitrogen (N) as n-type impurities. The n-type impurity concentration of the SBD cathode region 38 is, for example, higher than the n-type impurity concentration of the drift region 24.

The n-type impurity concentration of the SBD cathode region 38 is, for example, equal to or higher than the n-type impurity concentrations of the first low concentration region 36a, the second low concentration region 36b, and the third low concentration region 36c.

The n-type impurity concentration of the SBD cathode region 38 is, for example, $1\times10^{16}$ cm⁻³ or more and $2\times10^{17}$ cm⁻³ or less.

The n⁻-type first JFET region 40a is provided between the second low concentration region 36b and the first plane P1. The n⁻-type second JFET region 40b is provided between the third low concentration region 36c and the first plane P1.

The first JFET region 40a is provided between the gate electrode 18 and the second low concentration region 36b. The second JFET region 40b is provided between the gate electrode 18 and the third low concentration region 36c.

The first JFET region 40a is provided between the third body region 26c and the first body region 26a. The second JFET region 40b is provided between the second body region 26b and the fourth body region 26d.

When the MOSFET 100 is in the ON state, electrons flow, for example, from the source electrode 12, through the first source region 28a, the channel formed in the first body region 26a, the first JFET region 40a, the second low concentration region 36b, the drift region 24, and the drain region 22 to the drain electrode 14.

The first JFET region 40a and the second JFET region 40b contain, for example, nitrogen (N) as n-type impurities. The n-type impurity concentrations of the first JFET region 40a and the second JFET region 40b are, for example, higher than the n-type impurity concentration of the drift region 24.

The n-type impurity concentrations of the first JFET region 40a and the second JFET region 40b are, for example, equal to or higher than the n-type impurity concentrations of the second low concentration region 36b and the third low concentration region 36c.

The first JFET region 40a and the second JFET region 40b are, for example, $1\times10^{16}$ cm⁻³ or more and $2\times10^{17}$ cm⁻³ or less.

The gate electrode 18 is provided on a side of the first plane P1 of the silicon carbide layer 10. The gate electrode 18 extends in the first direction. A plurality of gate electrodes 18 are arranged in parallel with each other in the second direction orthogonal to the first direction.

The gate electrode 18 is a conductive layer. The gate electrode 18 is, for example, polycrystalline silicon containing p-type impurities or n-type impurities.

The gate electrode 18 faces, for example, a first portion B1. The first portion B1 is a portion of the first body region 26a in contact with the first plane P1.

The gate insulating layer 16 is provided between the gate electrode 18 and the first body region 26a, the second body region 26b, the third body region 26c, and the fourth body region 26d. The gate insulating layer 16 is provided between the gate electrode 18 and the first JFET region 40a and the second JFET region 40b.

The gate insulating layer 16 is, for example, provided between the first portion B1 and the gate electrode 18. The first portion B1 is a portion of the first body region 26a in contact with the first plane P1.

The gate insulating layer 16 is, for example, a silicon oxide. For example, a high-k insulating material (high dielectric constant insulating material) can be applied to the gate insulating layer 16.

The interlayer insulating layer 20 is provided on the gate electrode 18 and the silicon carbide layer 10. The interlayer insulating layer 20 is, for example, a silicon oxide.

The source electrode 12 is in contact with the first source region 28a, the second source region 28b, the third source region 28c, and the fourth source region 28d. The source electrode 12 is in contact with the first body contact region 32a, the second body contact region 32b, the third body contact region 32c, and the fourth body contact region 32d.

The source electrode 12 contains a metal. The metal constituting the source electrode 12 has, for example, a stacked structure of titanium (Ti) and aluminum (Al). The portion of the source electrode 12 in contact with the first source region 28a, the second source region 28b, the third source region 28c, and the fourth source region 28d is, for example, a metal silicide. The metal silicide is, for example, titanium silicide or nickel silicide. For example, no metal silicide is provided in a portion of the source electrode 12 in contact with the SBD cathode region 38.

The drain electrode 14 is provided on the back surface of the silicon carbide layer 10. The drain electrode 14 is in contact with the drain region 22.

The drain electrode 14 is, for example, a metal or a metal semiconductor compound. For example, the drain electrode 14 contains at least one material selected from the group consisting of nickel silicide, titanium (Ti), nickel (Ni), silver (Ag), and gold (Au).

Next, an example of the method of manufacturing the semiconductor device according to the first embodiment will be described. FIGS. 4, 5, 6, and 7 are schematic cross-sectional views in the process of manufacturing the semiconductor device according to the first embodiment.

Figure 4:
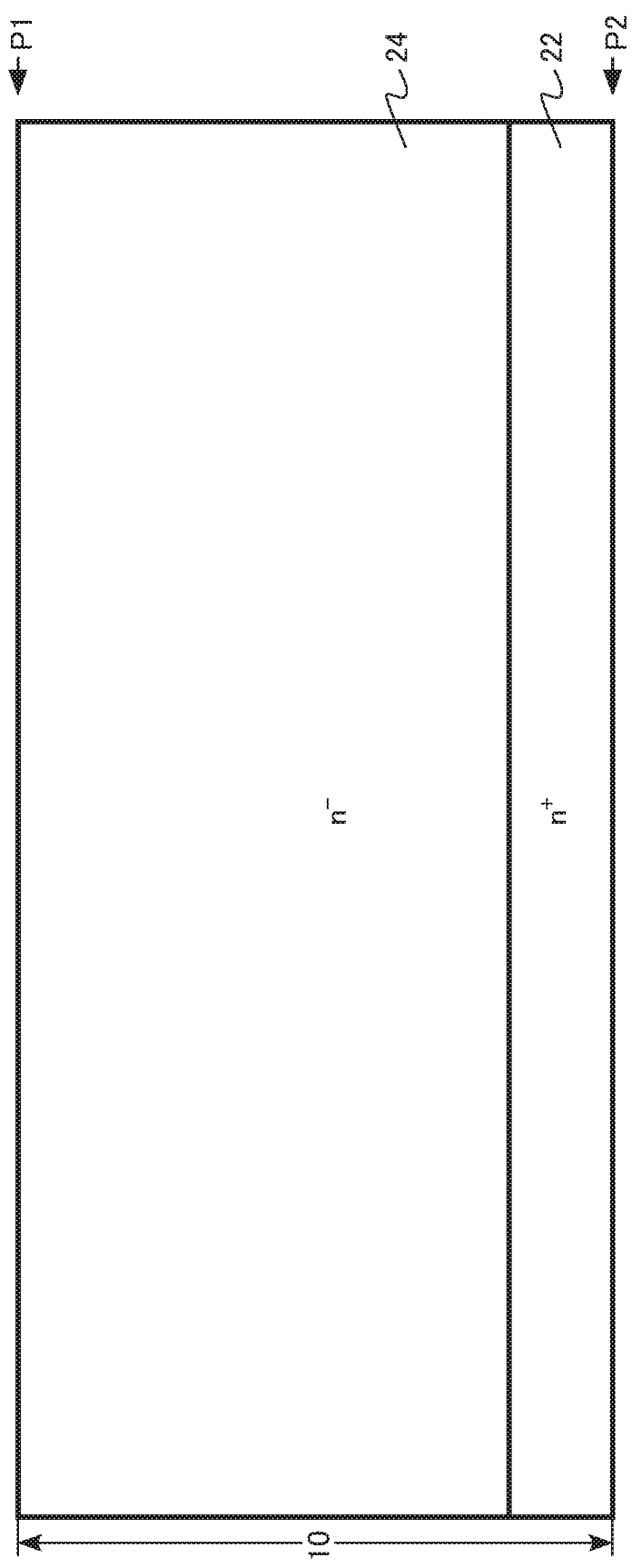
FIG. 4 is a schematic cross-sectional view in the process of manufacturing the semiconductor device according to the first embodiment.

First, the silicon carbide layer 10 is prepared (FIG. 4). The silicon carbide layer 10 has a first plane ("P1" in FIG. 1) and a second plane ("P2" in FIG. 1).

The silicon carbide layer 10 has the n$^+$-type drain region 22 and the n$^-$-type drift region 24. The drift region 24 is formed, for example, on the drain region 22 by an epitaxial growth method.

Figure 5:
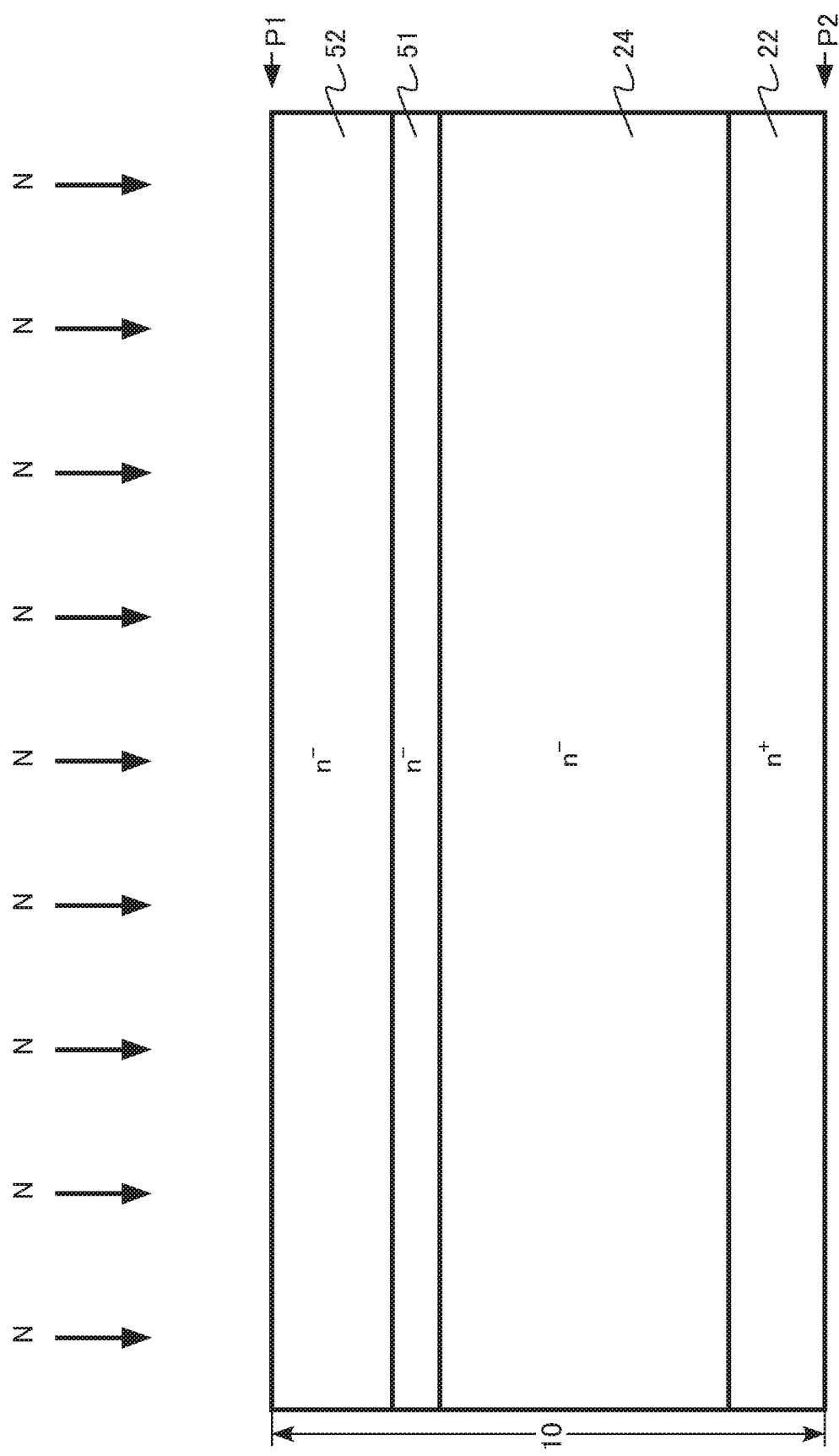
FIG. 5 is a schematic cross-sectional view in the process of manufacturing the semiconductor device according to the first embodiment.

Next, a first n$^-$-type region 51 and a second n$^-$-type region 52 are formed in the silicon carbide layer 10 (FIG. 5). The first n$^-$-type region 51 is a region which is to be later the n$^-$-type first low concentration region 36a, the n$^-$-type second low concentration region 36b, and the n$^-$-type third low concentration region 36c. In addition, the second n$^-$-type region 52 is a region which is to be later the n$^-$-type SBD cathode region 38, the n$^-$-type first JFET region 40a, and the n$^-$-type second JFET region 40b.

The first n$^-$-type region 51 and the second n$^-$-type region 52 are formed by ion-implanting nitrogen (N) from the first plane P1 side.

Next, a mask material 61 is formed by using a known film deposition method, a known lithography method, and a known dry etching method. Next, aluminum (Al) is ion-implanted from the first plane P1 side with the mask material 61 as a mask.

Figure 6:
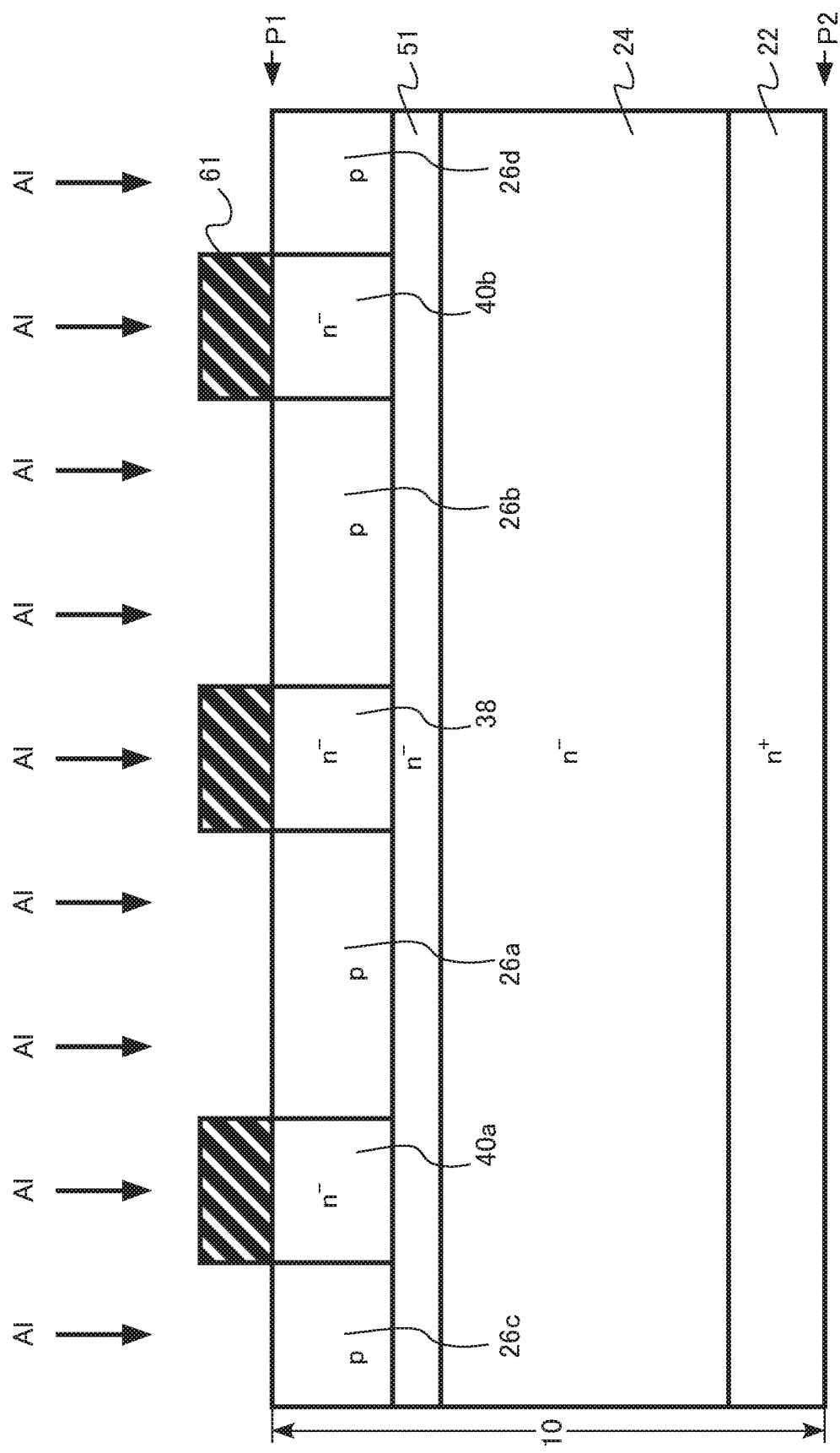
FIG. 6 is a schematic cross-sectional view in the process of manufacturing the semiconductor device according to the first embodiment.

The p-type first body region 26a, the p-type second body region 26b, the p-type third body region 26c, and the p-type fourth body region 26d are formed. In addition, the divided second n$^-$-type region 52 becomes the n$^-$-type SBD cathode region 38, the n$^-$-type first JFET region 40a, and the n$^-$-type second JFET region 40b (FIG. 6).

Figure 7:
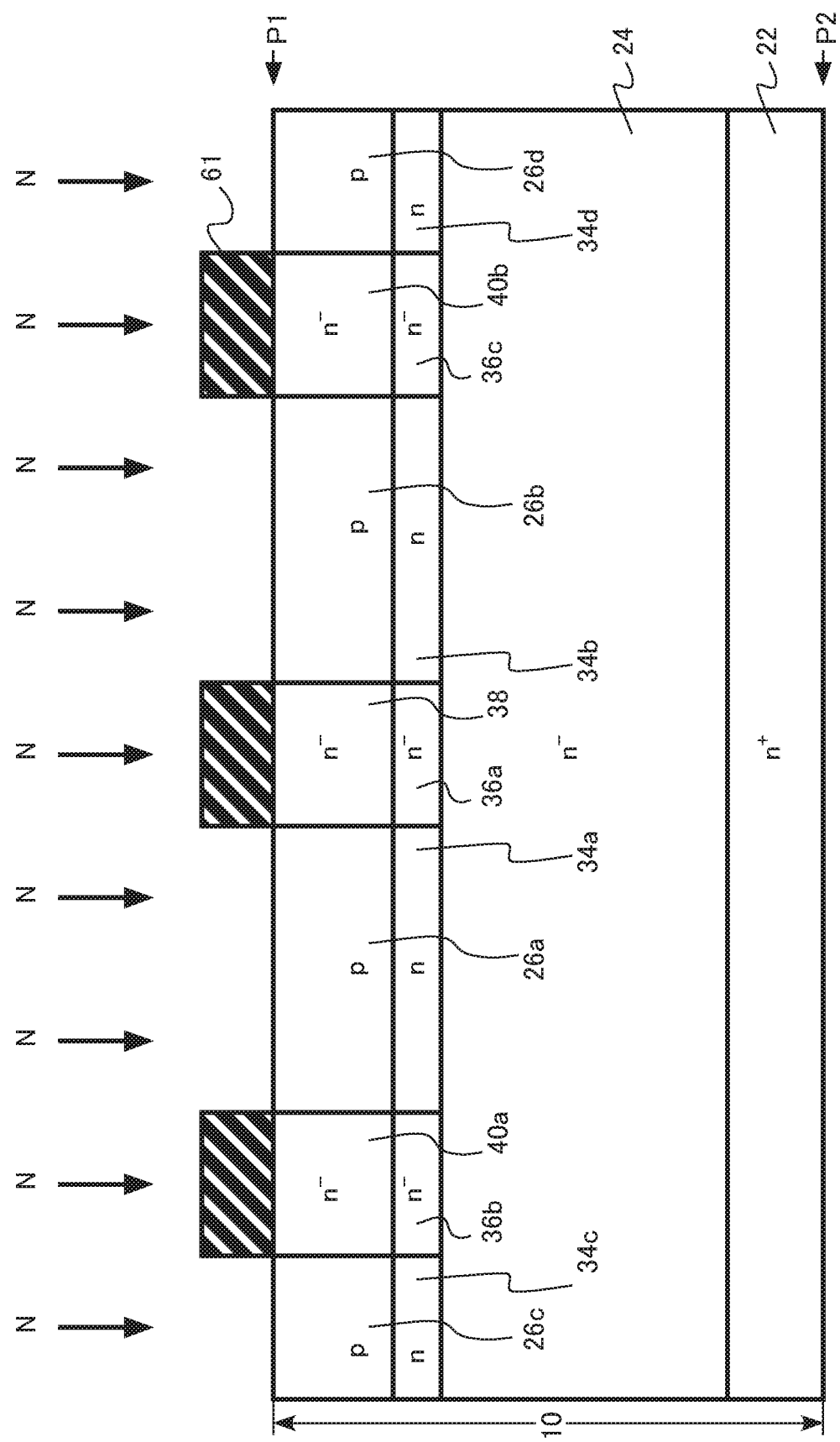
FIG. 7 is a schematic cross-sectional view in the process of manufacturing the semiconductor device according to the first embodiment.

Next, nitrogen (N) is ion-implanted from the first plane P1 side by using the mask material 61 as a mask. The n-type first high concentration region 34a, the n-type second high concentration region 34b, the n-type third high concentration region 34c, and the n-type fourth high concentration region 34d are formed. In addition, a portion of the first n$^-$-type region 51 becomes the n$^-$-type first low concentration region 36a, the n$^-$-type second low concentration region 36b, and the n$^-$-type third low concentration region 36c (FIG. 7).

By using the same mask material 61 as the mask material used for forming the p-type first body region 26a, the p-type second body region 26b, the p-type third body region 26c, and the p-type fourth body region 26d, it is possible to form the n-type first high concentration region 34a, the n-type second high concentration region 34b, the n-type third high concentration region 34c, and the n-type fourth high concentration region 34d.

After that, the n$^+$-type first source region 28a, the n$^+$-type second source region 28b, the n$^+$-type third source region 28c, the n$^+$-type fourth source region 28d, the n$^+$-type first n-type region 30a, the n$^+$-type second n-type region 30b, the p$^+$-type first body contact region 32a, the p$^+$-type second body contact region 32b, the p$^+$-type third body contact region 32c, the p$^+$-type fourth body contact region 32d, the gate insulating layer 16, the gate electrode 18, the interlayer insulating layer 20, the source electrode 12, and the drain electrode 14 are formed by the well-known process technique.

According to the above-described manufacturing method, the MOSFET 100 illustrated in FIG. 1 is manufactured.

Next, the functions and effects of the MOSFET 100 according to the first embodiment will be described.

Figure 8:
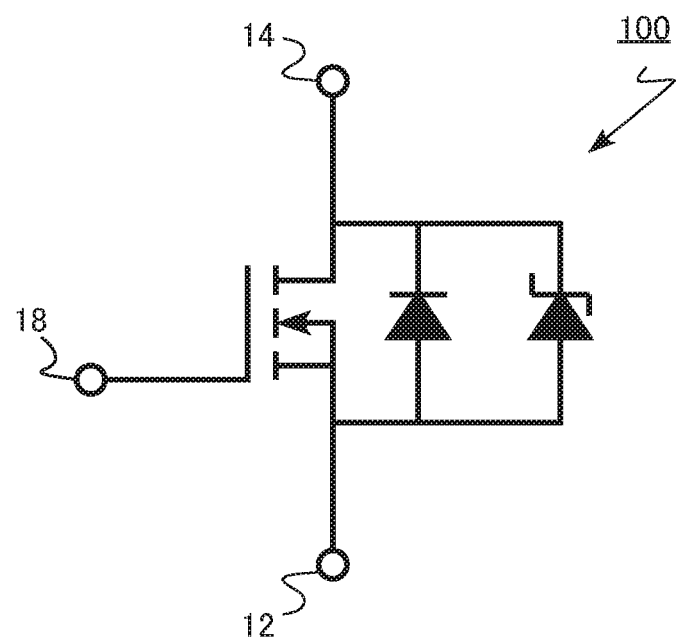
FIG. 8 is an equivalent circuit diagram of the semiconductor device according to the first embodiment.

FIG. 8 is an equivalent circuit diagram of the semiconductor device according to the first embodiment. Between the source electrode 12 and the drain electrode 14, a pn diode and an SBD are connected in parallel to the transistor as built-in diodes. The first body region 26a, the second body region 26b, the third body region 26c, and the fourth body region 26d are the anode of the pn junction diode, and the drift region 24 is the cathode of the pn junction diode. In addition, the source electrode 12 becomes the anode of the SBD and the SBD cathode region 38 becomes the cathode of the SBD.

For example, considered is a case where the MOSFET 100 is used as a switching element connected to an inductive load. When the MOSFET 100 is turned off, in some cases, a voltage that makes the source electrode 12 positive relative to the drain electrode 14 may be applied due to a load current caused by the inductive load. In this case, forward current flows in the built-in diode. This state is also called a reverse conduction state.

The forward voltage (Vf) at which the forward current starts to flow in the SBD is lower than the forward voltage (Vf) of the pn junction diode. Therefore, first, the forward current flows in the SBD.

The forward voltage (Vf) of the SBD is, for example, 1.0 V. The forward voltage (Vf) of the pn junction diode is, for example, 2.5 V.

The SBD performs unipolar operation. For this reason, even if the forward current flows, stacking faults do not grow in the silicon carbide layer 10 due to the recombination energy of carriers.

When the voltage applied during the pn junction of the pn junction diode exceeds the forward voltage (Vf) of the pn junction diode after the forward current starts to flow in the SBD, the forward current flows in the pn junction diode. The pn junction diode performs a bipolar operation.

Minority carriers are injected into the drift region 24 from the first body region 26a, the second body region 26b, the third body region 26c, and the fourth body region 26d by the bipolar operation. For this reason, stacking faults grow in the silicon carbide layer 10 due to the recombination energy of carriers. Therefore, there is a problem in that the on-resistance of the MOSFET 100 increases.

Figure 9:
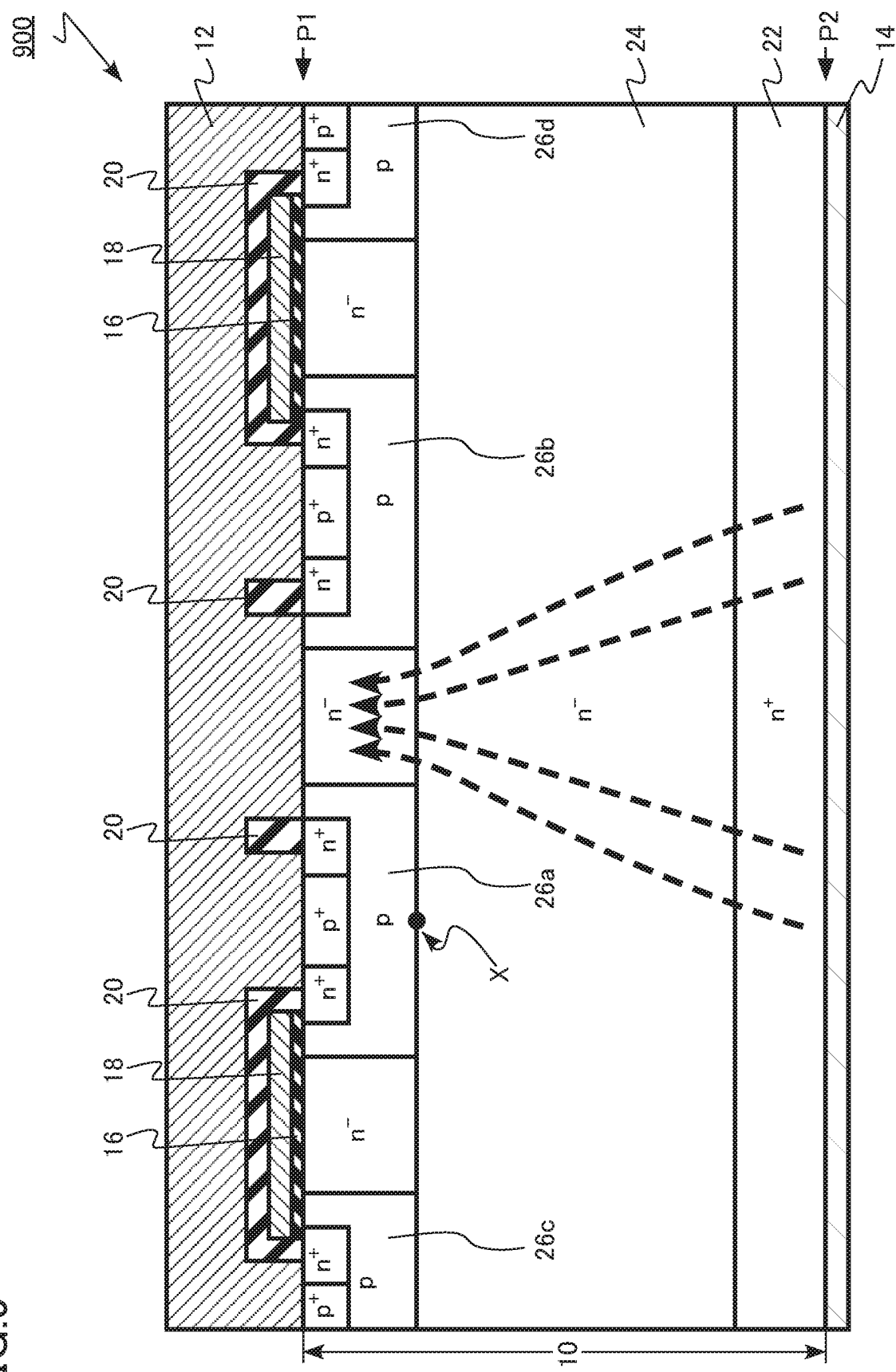
FIG. 9 is an explanatory diagram of functions and effects of the semiconductor device according to the first embodiment.

FIG. 9 is an explanatory diagram of the functions and effects of the semiconductor device according to the first embodiment. FIG. 9 is a schematic cross-sectional view of a MOSFET 900 according to Comparative Example 1. The cross section corresponds to the cross section of FIG. 1.

FIG. 9 is a diagram illustrating a path of a current flowing in a built-in diode of the MOSFET 900 according to Comparative Example 1. The MOSFET 900 according to Comparative Example 1 is different from the MOSFET 100 according to the first embodiment in that the first high concentration region 34a, the second high concentration region 34b, the third high concentration region 34c, the fourth high concentration region 34d, the first low concentration region 36a, the second low concentration region 36b, and the third low concentration region 36c are not included.

In FIG. 9, the flow of electrons in a state where the forward current starts to flow in the SBD is indicated by a dotted arrow. When the voltage applied to the pn junction of the pn junction diode exceeds the forward voltage (Vf) of the pn junction diode, a forward current flows in the pn junction diode. That is, when the voltage applied between the first body region 26a, the second body region 26b, the third body region 26c, and the fourth body region 26d and the drift region 24 exceeds the forward voltage (Vf) of the pn junction diode, a forward current flows in the pn junction diode.

In the case according to Comparative Example 1, the density of flow of electrons flowing through the bottoms of the first body region 26a and the second body region 26b, for example, the portion near the point X in FIG. 9 is low. For this reason, the voltage drop due to the wraparound of the electrostatic potential of the drift region 24 at the bottom of the first body region 26a is small. The wraparound of the electrostatic potential occurs by the flow of electrons flowing at the bottom of the first body region 26a.

Therefore, at the point X, the voltage applied between the first body region 26a and the drift region 24 is hard to decrease. Accordingly, at the point X, the voltage easily exceeds the forward voltage (Vf) of the pn junction diode.

Figure 10:
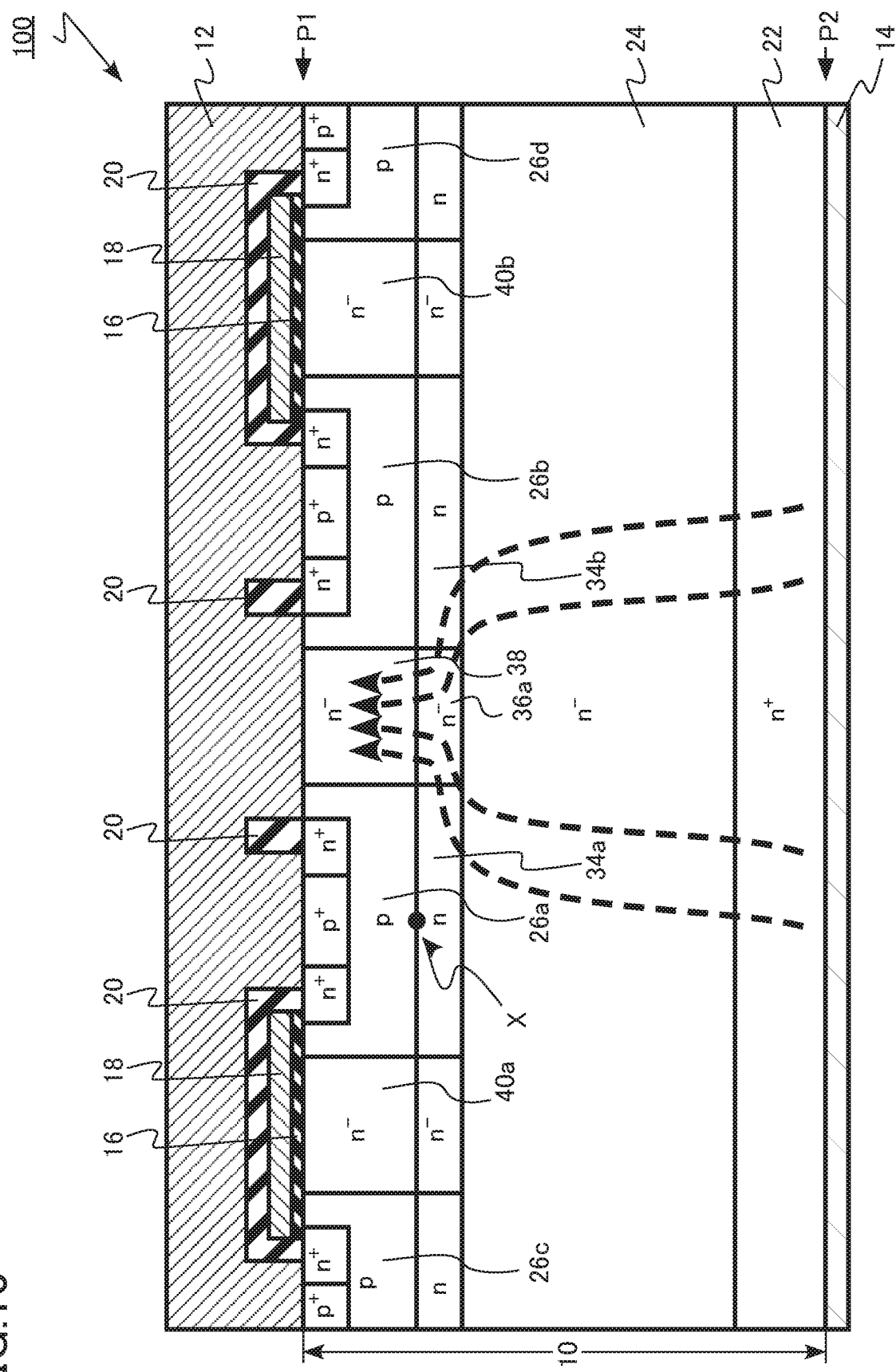
FIG. 10 is an explanatory diagram of the functions and effects of the semiconductor device according to the first embodiment.

FIG. 10 is an explanatory diagram of the functions and effects of the semiconductor device according to the first embodiment. FIG. 10 is a diagram illustrating a path of a current flowing in a built-in diode of the MOSFET 100 according to the first embodiment. In FIG. 10, the flow of electrons in a state where the forward current starts to flow in the SBD is indicated by a dotted arrow.

The MOSFET 100 includes the first high concentration region 34a, the second high concentration region 34b, the third high concentration region 34c, and the fourth high concentration region 34d which are higher in n-type impurity concentration and lower in electrical resistance than the drift region 24. For this reason, the density of the electron flow flowing through the bottoms of the first body region 26a and the second body region 26b, for example, in the vicinity of the point X in FIG. 10, increases. The voltage drop due to the wraparound of the electrostatic potential of the first high concentration region 34a at the bottom of the first body region 26a becomes large.

Therefore, at the point X, the voltage applied between the first body region 26a and the first high concentration region 34a decreases in comparison with the case of Comparative Example 1. Accordingly, at the point X, the voltage does not easily exceed the forward voltage (Vf) of the pn junction diode, and thus, the forward operation of the pn junction diode hardly occurs.

According to the MOSFET 100 according to the first embodiment, the forward current hardly flows in the pn junction diode that performs the bipolar operation. Therefore, growth of the stacking faults in the silicon carbide layer 10 due to the recombination energy of carriers can be suppressed.

It is preferable that the n-type impurity concentration of the SBD cathode region 38 is higher than the n-type impurity concentration of the drift region 24 from the viewpoint that the forward operation of the pn junction diode hardly occurs. By increasing the n-type impurity concentration of the SBD cathode region 38, the voltage drop of the first high concentration region 34a and the second high concentration region 34b at the bottoms of the first body region 26a and the second body region 26b due to the flow of electrons becomes large.

On the other hand, if the n-type impurity concentration of the SBD cathode region 38 becomes too high, the Schottky barrier of the SBD decreases, and thus, there is a concern that a decrease in the breakdown voltage and an increase in the leakage current of the SBD may occur. In addition, if the n-type impurity concentration of the SBD cathode region 38 becomes too high, the depletion layer does not sufficiently grow from the first body region 26a and the second body region 26b toward the SBD cathode region 38 when the SBD is turned off, and there is a concern that a decrease in the breakdown voltage and an increase in the leakage current of the SBD may occur. Therefore, it is preferable that the n-type impurity concentration of the SBD cathode region 38 is lower than the n-type impurity concentration of the first high concentration region 34a and the second high concentration region 34b.

Furthermore, in the MOSFET 100 according to the first embodiment, the first low concentration region 36a having a low n-type impurity concentration is provided between the first high concentration region 34a and the second high concentration region 34b. Therefore, when the SBD is turned off, the depletion layer expands from the first body region 26a and the second body region 26b toward the first low concentration region 36a, so that an increase in the leakage current and a decrease in the breakdown voltage in the reverse characteristics of the SBD are suppressed.

Figure 11A:
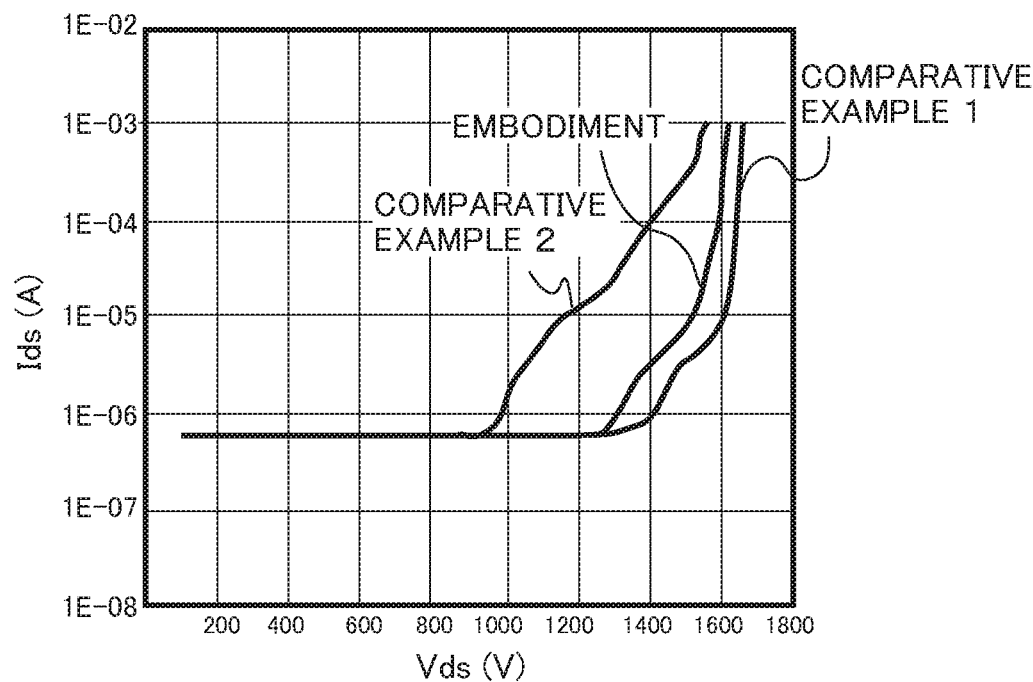
FIGS. 11A and 11B are explanatory diagrams of the functions and effects of the semiconductor device according to the first embodiment.
Figure 11B:
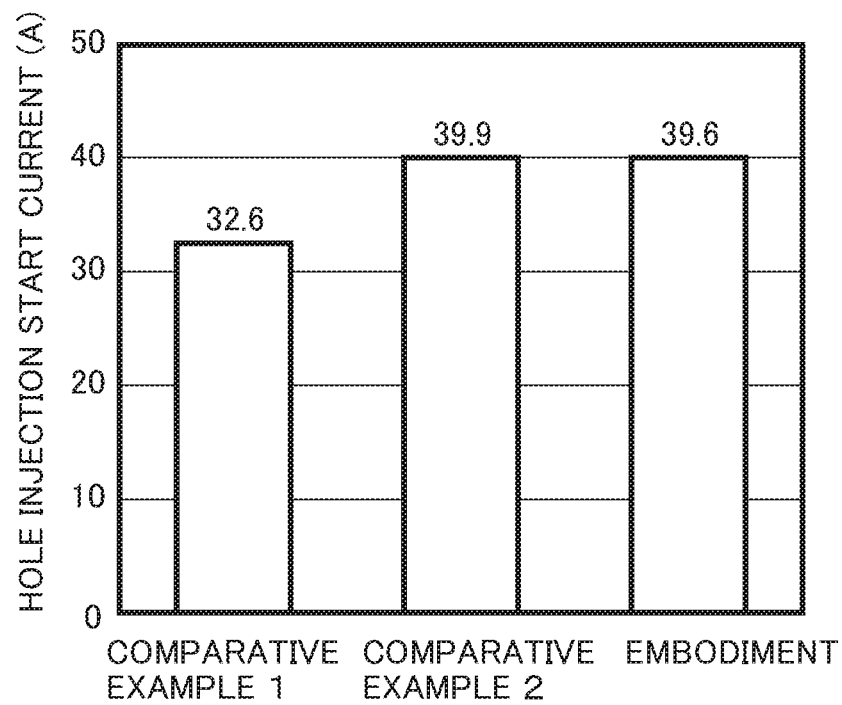

FIGS. 11A and 11B are explanatory diagrams of the functions and effects of the semiconductor device according to the first embodiment. FIG. 11A is a view showing a simulation result of the reverse current-voltage characteristics of the SBD. FIG. 11B is a view showing a simulation result of the hole injection start current of the SBD.

FIGS. 11A and 11B are simulation results of the SBDs built in the MOSFET 900 according to Comparative Example 1, the MOSFET according to Comparative Example 2, and the MOSFET 100 according to the embodiment. In the MOSFET according to Comparative Example 2, a region having an n-type impurity concentration equal to those of the first high concentration region 34a and the second high concentration region 34b is formed between the first high concentration region 34a and the second high concentration region 34b of the MOSFET 100. In other words, a portion of the first low concentration region 36a of the MOSFET 100 has a concentration equal to those of the first high concentration region 34a and the second high concentration region 34b.

In addition, the hole injection start current in FIG. 11B is the value of the forward current when the forward current starts to flow in the pn junction diode after the forward current flows in the SBD. From the viewpoint of suppressing the growth of the stacking faults due to the recombination energy of carriers, it is preferable that the hole injection start current is high.

In Comparative Example 2, as shown in FIG. 11B, the hole injection start current is higher than that of Comparative Example 1. Therefore, an increase in on-resistance due to growth of the stacking faults is suppressed. It is considered that this is caused by having the first high concentration region 34a and the second high concentration region 34b.

However, in Comparative Example 2, as shown in FIG. 11A, the reverse leakage current of the SBD is higher than that in Comparative Example 1. It is considered that this is caused by the high n-type impurity concentration between the first high concentration region 34a and the second high concentration region 34b.

In the embodiment, similarly to Comparative Example 2, as shown in FIG. 11B, the hole injection start current is higher than that in Comparative Example 1. Then, as shown in FIG. 11A, the reverse leakage current of the SBD is greatly suppressed in comparison with Comparative Example 2. It is considered that this is caused by providing the first low concentration region 36a having a low n-type impurity concentration between the first high concentration region 34a and the second high concentration region 34b.

In the embodiment, it is possible to realize a high hole injection start current and a low leak current.

It is preferable that the n-type impurity concentrations of the first low concentration region 36a, the second low concentration region 36b, and the third low concentration region 36c are 5% or more and 80% or less of the n-type impurity concentrations of the first high concentration region 34a, the second high concentration region 34b, the third high concentration region 34c, and the fourth high concentration region 34d. If the n-type impurity concentrations fall below the above range, there is a concern that a decrease in the forward current of the SBD may occur. If n-type impurity concentrations exceed the above range, there is a concern that a decrease in the breakdown voltage and an increase in the leakage current of the SBD may occur.

From the viewpoint of increasing the on-current of the MOSFET 100, it is preferable that the resistance of the JFET region 32 is low. Therefore, it is preferable that the n-type impurity concentration of the JFET region 32 is higher than the n-type impurity concentration of the drift region 24.

As described above, according to the first embodiment, the operation of the pn junction diode built in the MOSFET hardly occurs. Therefore, a MOSFET which suppresses the growth of the stacking faults in the silicon carbide layer and enables improvement in reliability is realized. In addition, a decrease in breakdown voltage and an increase in leakage current of the SBD included as a built-in diode are suppressed.

Second Embodiment

A MOSFET according to a second embodiment is different from that of the first embodiment in that the ninth silicon carbide region is located between the first portion and the first silicon carbide region. Hereinafter, redundant description of the same components as those of the first embodiment will be omitted.

Figure 12:
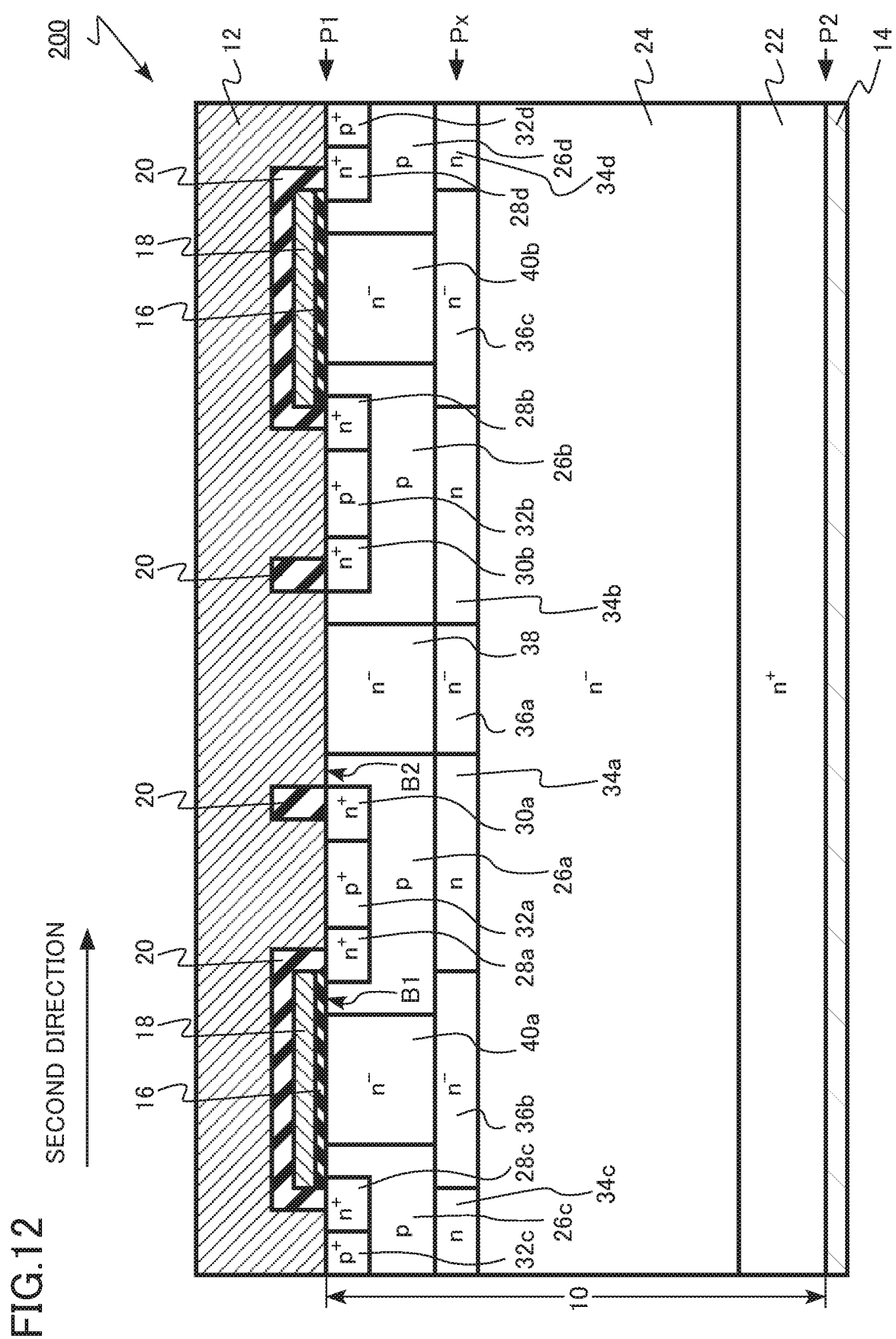
FIG. 12 is a schematic cross-sectional view of a semiconductor device according to a second embodiment.

FIG. 12 is a schematic cross-sectional view of a semiconductor device according to the second embodiment. FIG. 12 is a cross-sectional view corresponding to FIG. 1 of the first embodiment.

The semiconductor device according to the second embodiment is a planar gate type vertical MOSFET 200 using silicon carbide. The MOSFET 200 according to the second embodiment is a DIMOSFET. In addition, the semiconductor device according to the second embodiment includes an SBD as a built-in diode.

Hereinafter, a case where the first conductivity type is n-type and the second conductivity type is p-type will be described as an example. The MOSFET 200 is a vertical type n-channel MOSFET using electrons as carriers.

The MOSFET 200 includes a silicon carbide layer 10, a source electrode 12 (first electrode), a drain electrode 14 (second electrode), a gate insulating layer 16, a gate electrode 18, and an interlayer insulating layer 20.

In the silicon carbide layer 10, an $n^+$-type drain region 22, an $n^-$-type drift region 24 (first silicon carbide region), a p-type first body region 26a (second silicon carbide region), a p-type second body region 26b (third silicon carbide region), a p-type third body region 26c, a p-type fourth body region 26d, an $n^+$-type first source region 28a (fourth silicon carbide region), an $n^+$-type second source region 28b, an $n^+$-type third source region 28c, an $n^+$-type fourth source region 28d, an $n^+$-type first n-type region 30a, an $n^+$-type second n-type region 30b, a $p^+$-type first body contact region 32a, a $p^+$-type second body contact region 32b, a $p^+$-type third body contact region 32c, a $p^+$-type fourth body contact region 32d, an n-type first high concentration region 34a (fifth silicon carbide region), an n-type second high concentration region 34b (sixth silicon carbide region), an n-type third high concentration region 34c, an n-type fourth high concentration region 34d, an $n^-$-type first low concentration region 36a (seventh silicon carbide region), an $n^-$-type second low concentration region 36b (ninth silicon carbide region), an $n^-$-type third low concentration region 36c, an $n^-$-type SBD cathode region 38 (eighth silicon carbide region), an $n^-$-type first JFET region 40a, and an $n^-$-type second JFET region 40b are provided.

The $n^-$-type second low concentration region 36b is provided between the third high concentration region 34c and the first high concentration region 34a. The second low concentration region 36b is provided between a first portion ("B1" in FIG. 12) where the first body region 26a is in contact with the first plane P1 and the drift region 24.

The width of the second low concentration region 36b in the second direction is larger than the width of the first JFET region 40a in the second direction. The width of the first high concentration region 34a in the second direction is smaller than the width of the first body region 26a in the second direction.

The first high concentration region 34a is located between the end portion and the vicinity of the end portion of the first body region 26a on the second body region 26b side and the drift region 24. The first high concentration region 34a is located between the second part ("B2" in FIG. 12) where the first body region 26a is in contact with the first plane P1 and the drift region 24.

The $n^-$-type third low concentration region 36c is provided between the second high concentration region 34b and the fourth high concentration region 34d. The third low concentration region 36c is provided between the portion where the second body region 26b is in contact with the first plane P1 and the drift region 24.

The width of the third low concentration region 36c in the second direction is larger than that of the second JFET region 40b in the second direction. The width of the second high concentration region 34b in the second direction is smaller than the width of the second body region 26b in the second direction.

The second high concentration region 34b is located between the end portion and the vicinity of the end portion of the second body region 26b on the first body region 26a side and the drift region 24. The second high concentration region 34b is located between the portion where the second body region 26b is in contact with the first plane P1 and the drift region 24.

Figure 13:
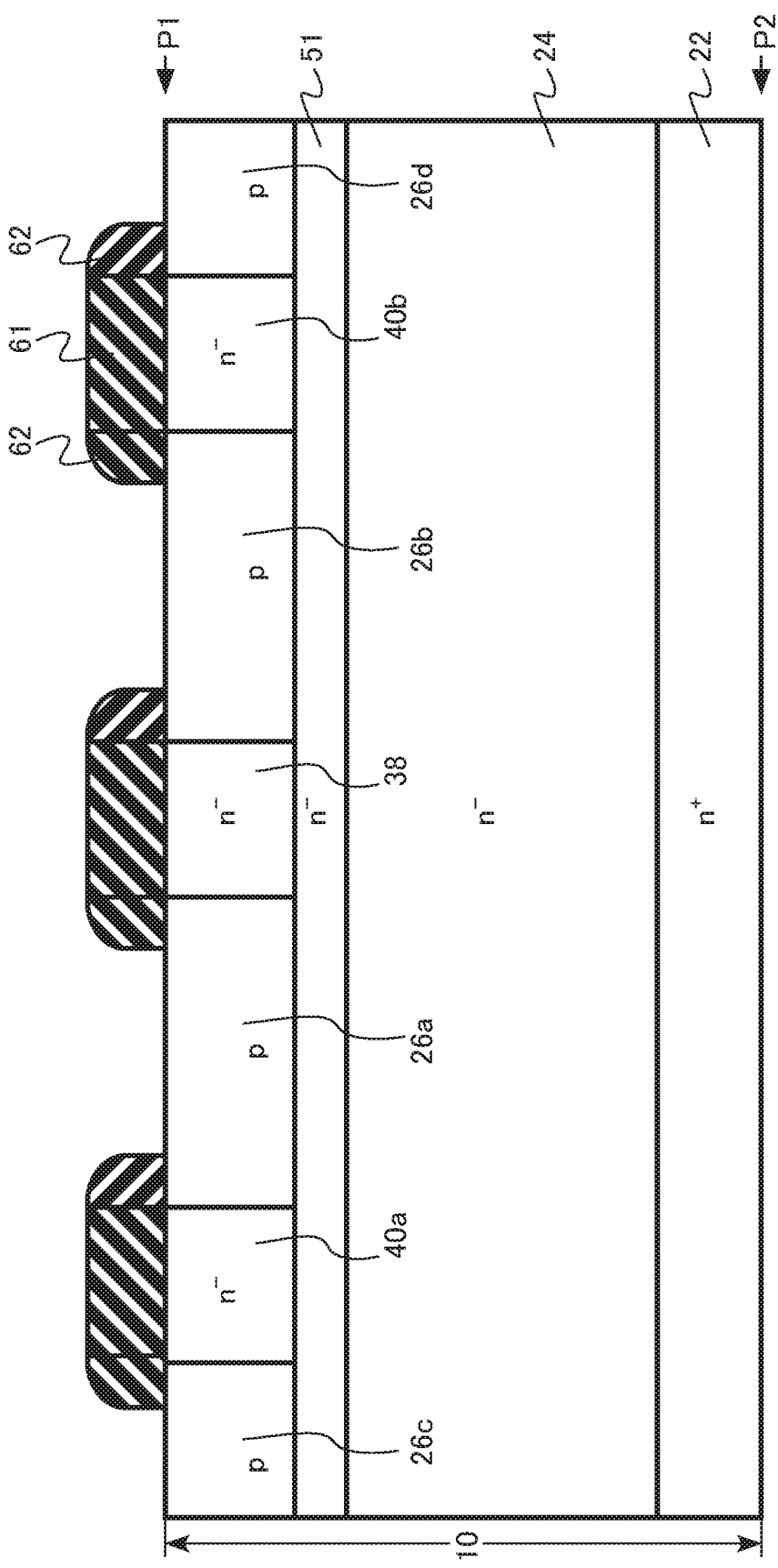
FIG. 13 is a schematic cross-sectional view in the process of manufacturing the semiconductor device according to the second embodiment.
Figure 14:
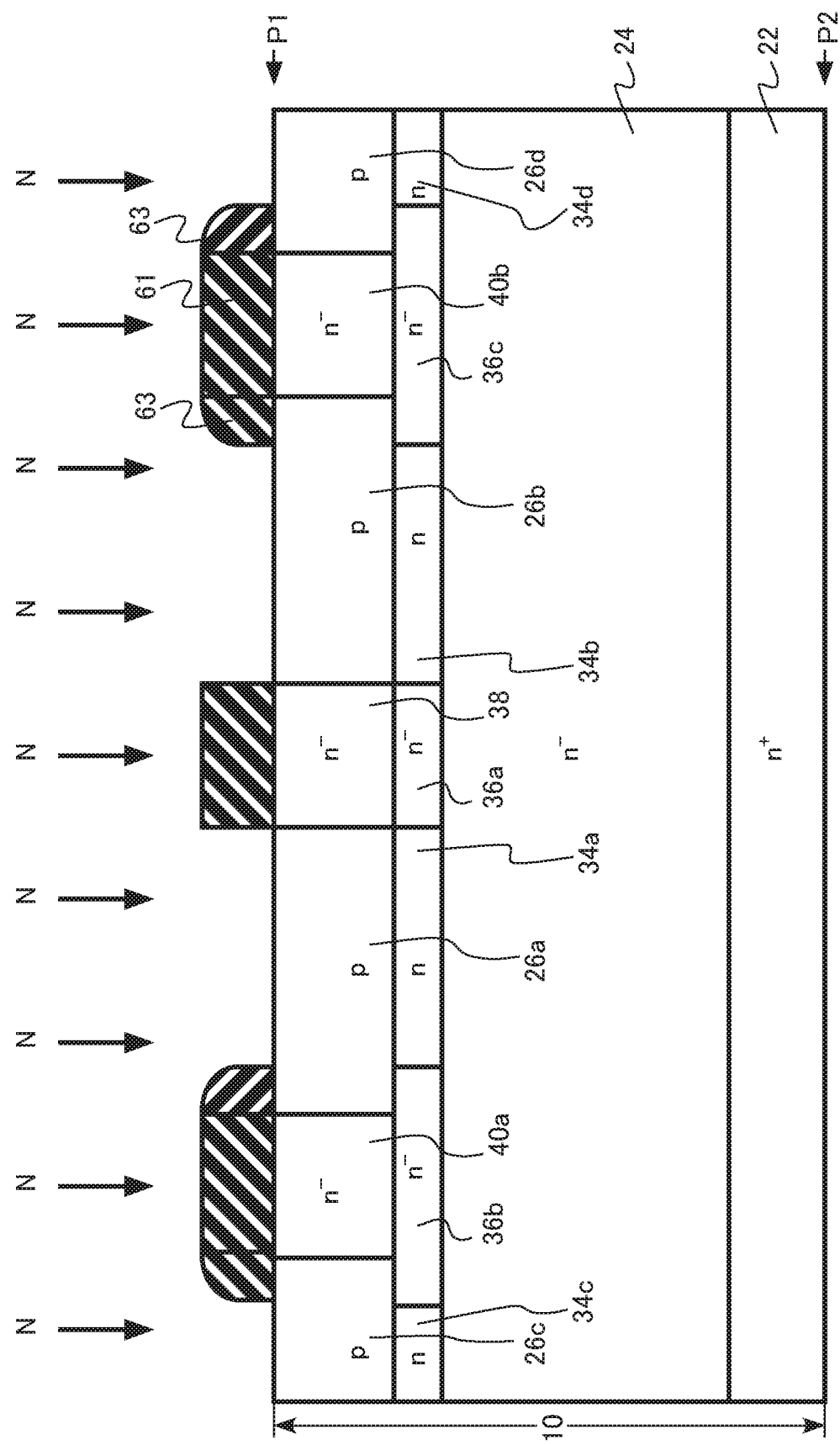
FIG. 14 is a schematic cross-sectional view in the process of manufacturing the semiconductor device according to the second embodiment.

Next, an example of the method of manufacturing the semiconductor device according to the second embodiment will be described. FIGS. 13 and 14 are schematic cross-sectional views in the process of manufacturing the semiconductor device according to the second embodiment.

The processes in which aluminum (Al) is ion-implanted from the first plane P1 side by using a mask material 61 as a mask and the p-type first body region 26a, the p-type second body region 26b, the p-type third body region 26c, and the p-type fourth body region 26d are formed are the same as those of the manufacturing method according to the first embodiment.

Next, a sidewall 62 is formed on the side surface of the mask material 61 by using a known film deposition method and a known dry etching method (FIG. 13).

Next, a portion of the sidewall 62 is selectively etched with respect to the mask material 61 by using a known lithography method and a known wet etching method.

Next, nitrogen (N) is ion-implanted from the first plane P1 side by using the mask material 61 and the sidewall 62 as a mask. The n-type first high concentration region 34a, the n-type second high concentration region 34b, the n-type third high concentration region 34c, and the n-type fourth high concentration region 34d are formed. In addition, a portion of the first n$^-$-type region 51 becomes the n$^-$-type first low concentration region 36a, the n$^-$-type second low concentration region 36b, and the n$^-$-type third low concentration region 36c (FIG. 14).

By using the same mask material 61 as the mask material used for forming the p-type first body region 26a, the p-type second body region 26b, the p-type third body region 26c, and the p-type fourth body region 26d, it is possible to form the n-type first high concentration region 34a, the n-type second high concentration region 34b, the n-type third high concentration region 34c, and the n-type fourth high concentration region 34d.

In addition, by using the sidewall 62 provided on the side surface of the mask material 61, it is possible to decrease the widths of the first high concentration region 34a and the second high concentration region 34b in the second direction. In addition, it is possible to increase the widths of the second low concentration region 36b and the third low concentration region 36c in the second direction.

After that, the n$^+$-type first source region 28a, the n$^+$-type second source region 28b, the n$^+$-type third source region 28c, the n$^+$-type fourth source region 28d, the n$^+$-type first n-type region 30a, the n$^+$-type second n-type region 30b, the p$^+$-type first body contact region 32a, the p$^+$-type second body contact region 32b, the p$^+$-type third body contact region 32c, the p$^+$-type fourth body contact region 32d, the gate insulating layer 16, the gate electrode 18, the interlayer insulating layer 20, the source electrode 12, and the drain electrode 14 are formed by the well-known process technique.

According to the above-described manufacturing method, the MOSFET 200 illustrated in FIG. 12 is manufactured.

Next, the functions and effects of the MOSFET 200 of the second embodiment will be described.

For example, if the n-type impurity concentration on the second plane P2 side of the end portion of the first body region 26a on the first JFET region 40a side becomes too high, when the MOSFET 200 is turned off, the depletion layer does not sufficiently grow from the first body region 26a toward the first JFET region 40a side, and the field strength in the gate insulating layer 16 increases, and thus, there is a concern that the reliability of the gate insulating layer 16 may deteriorate.

In the MOSFET 200, the width of the second low concentration region 36b in the second direction is larger than the width of the first JFET region 40a in the second direction. In other words, the second low concentration region 36b is located on the second plane P2 side of the end portion of the first body region 26a on the first JFET region 40a side.

Therefore, the n-type impurity concentration on the second plane P2 side of the end portion of the first body region 26a on the first JFET region 40a side is low. Therefore, when the MOSFET 200 is turned off, the depletion layer sufficiently grows from the first body region 26a toward the first JFET region 40a side. Therefore, a deterioration in the reliability of the gate insulating layer 16 is suppressed.

As described above, according to the second embodiment, similarly to the first embodiment, the operation of the pn junction diode built in the MOSFET hardly occurs. Therefore, a MOSFET which suppresses the growth of the stacking faults in the silicon carbide layer and enables improvement in reliability is realized. In addition, a decrease in breakdown voltage and an increase in leakage current of the SBD included as a built-in diode are suppressed. In addition, a deterioration in the reliability of the gate insulating layer is suppressed.

Third Embodiment

A MOSFET according to a third embodiment is different from those of the first and second embodiments in that the ninth silicon carbide region is located between the portion where the fourth silicon carbide region is in contact with the first electrode and the first silicon carbide region. Hereinafter, redundant description of the same components as those of the first and second embodiments will be omitted.

Figure 15:
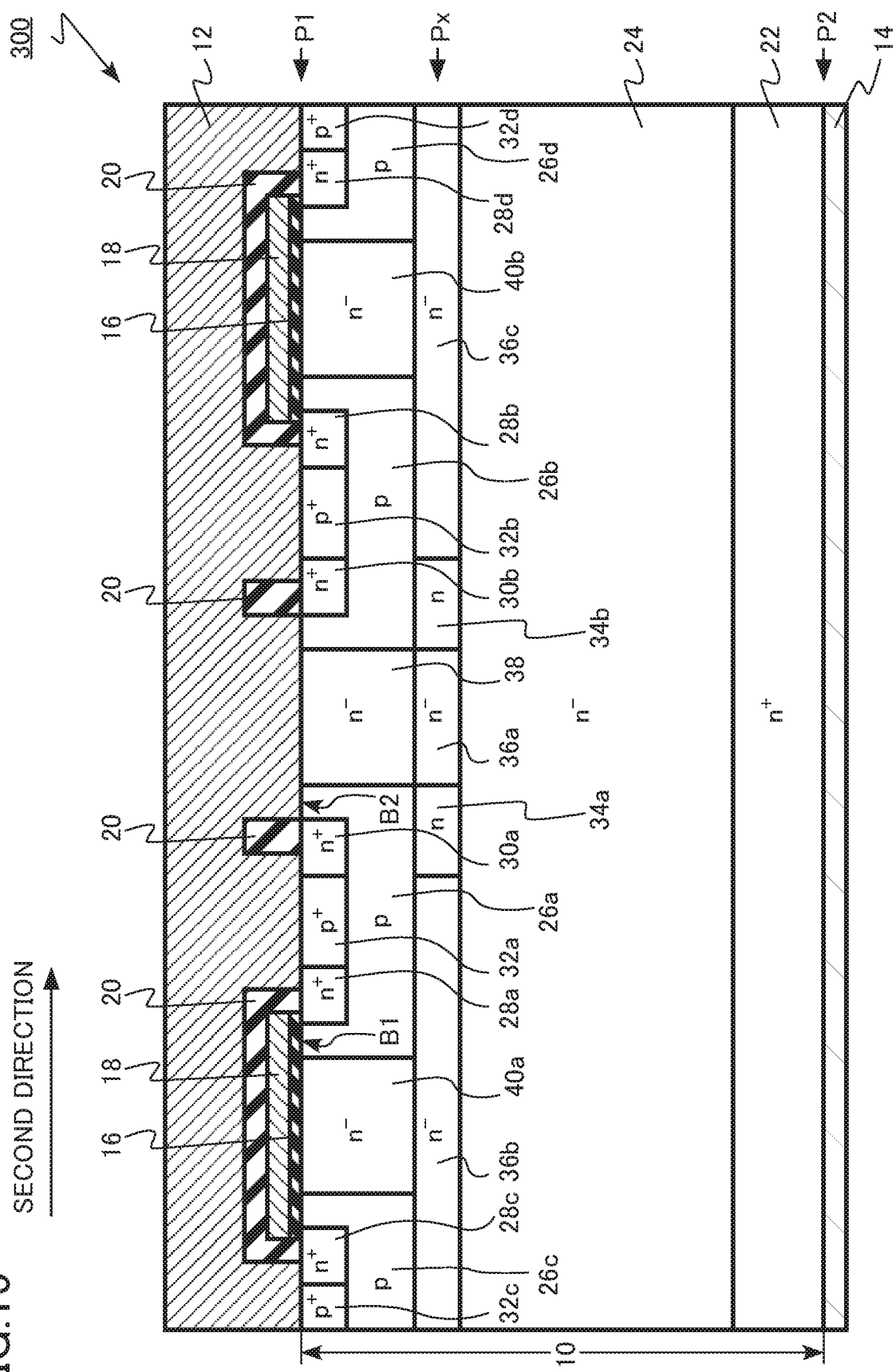
FIG. 15 is a schematic cross-sectional view of a semiconductor device according to a third embodiment.

FIG. 15 is a schematic cross-sectional view of a semiconductor device according to the third embodiment. FIG. 15 is a cross-sectional view corresponding to FIG. 1 of the first embodiment.

The semiconductor device according to the third embodiment is a planar gate type vertical MOSFET 300 using silicon carbide. The MOSFET 300 according to the third embodiment is a DIMOSFET. In addition, the semiconductor device according to the third embodiment includes an SBD as a built-in diode.

Hereinafter, a case where the first conductivity type is n-type and the second conductivity type is p-type will be described as an example. The MOSFET 300 is a vertical type n-channel MOSFET using electrons as carriers.

The MOSFET 300 includes a silicon carbide layer 10, a source electrode 12 (first electrode), a drain electrode 14 (second electrode), a gate insulating layer 16, a gate electrode 18, and an interlayer insulating layer 20.

In the silicon carbide layer 10, an n$^+$-type drain region 22, an n$^-$-type drift region 24 (first silicon carbide region), a p-type first body region 26a (second silicon carbide region), a p-type second body region 26b (third silicon carbide region), a p-type third body region 26c, a p-type fourth body region 26d, an n$^+$-type first source region 28a (fourth silicon carbide region), an n$^+$-type second source region 28b, an n$^+$-type third source region 28c, an n$^+$-type fourth source region 28d, an n$^+$-type first n-type region 30a, an n$^+$-type second n-type region 30b, a p$^+$-type first body contact region 32a, a p$^+$-type second body contact region 32b, a p$^+$-type third body contact region 32c, a p⁺-type fourth body contact region 32d, an n-type first high concentration region 34a (fifth silicon carbide region), an n-type second high concentration region 34b (sixth silicon carbide region), an n⁻-type first low concentration region 36a (seventh silicon carbide region), an n⁻-type second low concentration region 36b (ninth silicon carbide region), an n⁻-type third low concentration region 36c, an n⁻-type SBD cathode region 38 (eighth silicon carbide region), an n⁻-type first JFET region 40a, and an n⁻-type second JFET region 40b are provided.

The n⁻-type second low concentration region 36b is provided between the portion where the first source region 28a is in contact with the source electrode 12 and the drift region 24. The second low concentration region 36b is provided between the portion where the first body contact region 32a is in contact with the source electrode 12 and the drift region 24.

The n⁻-type third low concentration region 36c is provided between the portion where the second source region 28b is in contact with the source electrode 12 and the drift region 24. The third low concentration region 36c is provided between a portion where the second body contact region 32b is in contact with the source electrode 12 and the drift region 24.

Next, the functions and effects of the MOSFET 300 according to the third embodiment will be described.

For example, if the n-type impurity concentration on the second plane P2 side of the end portion of the first body region 26a on the first JFET region 40a side becomes too high, when the MOSFET 300 is turned off, the depletion layer does not sufficiently grow from the first body region 26a toward the first JFET region 40a side, and the field strength in the gate insulating layer 16 increases, and thus, there is a concern that the reliability of the gate insulating layer 16 may deteriorate.

In the MOSFET 300, the second low concentration region 36b is located on the second plane P2 side of the end portion of the first body region 26a on the first JFET region 40a side. The width of the second low concentration region 36b in the second direction is larger than that of the MOSFET 200 of the second embodiment.

Therefore, in comparison with the MOSFET 200, when the MOSFET 300 is turned off, the depletion layer further grows from the first body region 26a toward the first JFET region 40a side. Therefore, a deterioration in the reliability of the gate insulating layer 16 is further suppressed.

As described above, according to the third embodiment, similarly to the first embodiment, the operation of the pn junction diode built in the MOSFET hardly occurs. Therefore, a MOSFET which suppresses the growth of the stacking faults in the silicon carbide layer and enables improvement in reliability is realized. In addition, a decrease in breakdown voltage and an increase in leakage current of the SBD included as a built-in diode are suppressed. In addition, a deterioration in the reliability of the gate insulating layer is suppressed.

In the first to third embodiments, a case where the 4H—SiC is used as a crystal structure of the SiC has been described as an example, but the invention may be applied to devices using SiC having other crystal structures such as 6H—SiC and 3C—SiC. In addition, a plane other than the (0001) plane may also be applied to the front surface of the silicon carbide layer 10.

In the first to third embodiments, a case where the first conductivity type is n-type and the second conductivity type is p-type has been described as an example, but the first conductivity type may be p-type and the second conductivity type may be n-type.

In the first to third embodiments, aluminum (Al) is exemplified as p-type impurities, but boron (B) may also be used. In addition, nitrogen (N) and phosphorus (P) are exemplified as n-type impurities, but arsenic (As), antimony (Sb), or the like may also be applied.

While certain embodiments have been described, these embodiments have been presented by way of example only, and are not intended to limit the scope of the inventions. Indeed, semiconductor devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:
1. A semiconductor device comprising:
a silicon carbide layer having a first surface and a second surface opposite to the first surface;
a first electrode provided on a side of the first surface of the silicon carbide layer;
a second electrode provided on a side of the second surface of the silicon carbide layer;
a first silicon carbide region of a first conductivity type provided in the silicon carbide layer;
a second silicon carbide region of a second conductivity type provided between the first silicon carbide region and the first surface and having a first portion in contact with the first surface;
a third silicon carbide region of the second conductivity type provided between the first silicon carbide region and the first surface and separated from the second silicon carbide region;
a fourth silicon carbide region of the first conductivity type provided between the second silicon carbide region and the first surface and in contact with the first electrode;
a fifth silicon carbide region of the first conductivity type provided between the first silicon carbide region and the second silicon carbide region, a first conductivity type impurity concentration of the fifth silicon carbide region being higher than a first conductivity type impurity concentration of the first silicon carbide region;
a sixth silicon carbide region of the first conductivity type provided between the first silicon carbide region and the third silicon carbide region, a first conductivity type impurity concentration of the sixth silicon carbide region being higher than the first conductivity type impurity concentration of the first silicon carbide region;
a seventh silicon carbide region of the first conductivity type provided between the fifth silicon carbide region and the sixth silicon carbide region, a first conductivity type impurity concentration of the seventh silicon carbide region being lower than the first conductivity type impurity concentration of the fifth silicon carbide region and the first conductivity type impurity concentration of the sixth silicon carbide region;
an eighth silicon carbide region of the first conductivity type provided between the seventh silicon carbide region and the first surface, the eighth silicon carbide region being in contact with the second silicon carbide region and the third silicon carbide region, and the eighth silicon carbide region being in contact with the first electrode;

a ninth silicon carbide region of a second conductivity type provided between the second silicon carbide region and the first surface, a second conductivity type impurity concentration of the ninth silicon carbide region being higher than a second conductivity type impurity concentration of the second silicon carbide region, and the ninth silicon carbide region being in contact with the first electrode;

a tenth silicon carbide region of a second conductivity type provided between the third silicon carbide region and the first surface, a second conductivity type impurity concentration of the tenth silicon carbide region being higher than a second conductivity type impurity concentration of the third silicon carbide region, and the tenth silicon carbide region being in contact with the first electrode;

a gate electrode provided on a side of the first surface of the silicon carbide layer and facing the first portion of the second silicon carbide region, the gate electrode extending in a first direction parallel to the first surface; and a gate insulating layer provided between the gate electrode and the first portion, wherein a distance between the fifth silicon carbide region and the sixth silicon carbide region is smaller than a distance between the ninth silicon carbide region and the tenth silicon carbide region, wherein a distance between the second surface and the gate electrode is larger than a distance between the second surface and the second silicon carbide region.

2. The semiconductor device according to claim 1, wherein the fifth silicon carbide region is located between an end portion of the second silicon carbide region and the first silicon carbide region, the end portion facing the third silicon carbide region.

3. The semiconductor device according to claim 1, further comprising: a eleventh silicon carbide region of the first conductivity type provided between the first silicon carbide region and the gate electrode, the eleventh silicon carbide region located in a same plane with the fifth silicon carbide region, the same plane being parallel to the first surface, and the eleventh silicon carbide region having a first conductivity type impurity concentration lower than the first conductivity type impurity concentration of the fifth silicon carbide region.

4. The semiconductor device according to claim 1, wherein the first conductivity type impurity concentration of the seventh silicon carbide region is 5% or more and 80% or less of the first conductivity type impurity concentration of the fifth silicon carbide region.

5. The semiconductor device according to claim 1, wherein the first conductivity type impurity concentration of the first silicon carbide region is $4\times10^{14}$ cm$^{-3}$ or more and $1\times10^{17}$ cm$^{-3}$ or less.

6. The semiconductor device according to claim 1, wherein the first conductivity type impurity concentration of the fifth silicon carbide region is $5\times10^{16}$ cm$^{-3}$ or more and $2\times10^{17}$ cm$^{-3}$ or less.

7. The semiconductor device according to claim 1, wherein the first conductivity type impurity concentration of the seventh silicon carbide region is $1\times10^{16}$ cm$^{-3}$ or more and $2\times10^{17}$ cm$^3$ or less.

8. The semiconductor device according to claim 1, wherein the fifth silicon carbide region, the sixth silicon carbide region, and the seventh silicon carbide region extend in the first direction.

9. The semiconductor device according to claim 1, wherein the first conductivity type impurity concentration of the seventh silicon carbide region is higher than the first conductivity type impurity concentration of the first silicon carbide region.

10. The semiconductor device according to claim 1,
wherein the second silicon carbide region has a second portion in contact with the first electrode, and
wherein the fifth silicon carbide region is located between the second portion and the first silicon carbide region.

11. The semiconductor device according to claim 1,
wherein an upper surface of the second silicon carbide region includes a second portion that defines an interface between the second silicon carbide region and the first electrode and is at a boundary between the second silicon carbide region and the eighth silicon carbide region, and wherein the fifth silicon carbide region is located between the second portion and the first silicon carbide region in a direction perpendicular to the first surface.

* * * * *